United States Patent
Masuoka et al.

(10) Patent No.: US 9,306,053 B2
(45) Date of Patent: Apr. 5, 2016

(54) METHOD FOR PRODUCING A SEMICONDUCTOR DEVICE WITH SURROUNDING GATE TRANSISTOR

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

(*) Notice: Subject to any disclaimer, the term of this patent is extended or adjusted under 35 U.S.C. 154(b) by 0 days.

(21) Appl. No.: 14/606,458

(22) Filed: Jan. 27, 2015

(65) Prior Publication Data
US 2015/0140755 A1 May 21, 2015

Related U.S. Application Data

(62) Division of application No. 14/074,951, filed on Nov. 8, 2013, now Pat. No. 9,000,513.

(60) Provisional application No. 61/725,247, filed on Nov. 12, 2012.

(51) Int. Cl.
*H01L 29/778* (2006.01)
*H01L 29/66* (2006.01)
(Continued)

(52) U.S. Cl.
CPC ...... *H01L 29/7788* (2013.01); *H01L 21/28035* (2013.01); *H01L 21/3085* (2013.01); *H01L 21/30604* (2013.01); *H01L 21/31111* (2013.01); *H01L 21/32115* (2013.01);
(Continued)

(58) Field of Classification Search
None
See application file for complete search history.

(56) References Cited

U.S. PATENT DOCUMENTS 5,158,901 A 10/1992 Kosa et al.
8,138,048 B2 3/2012 Masuoka et al.
(Continued)

FOREIGN PATENT DOCUMENTS

| | | |
|---|---|---|
| JP | 02071556 A | 3/1990 |
| JP | 02188966 | 7/1990 |
| JP | 03145761 A | 6/1991 |
| JP | 2009182317 A | 8/2009 |
| JP | 2010258345 A | 11/2010 |
| JP | 2010272874 A | 12/2010 |
| JP | 2011040682 A | 2/2011 |
| JP | 2011258780 A | 12/2011 |
| JP | 2012004244 A | 1/2012 |
| WO | 2009154293 A1 | 12/2009 |

OTHER PUBLICATIONS

Wu, C.C., et al., "High performance 22/20nm FinFET CMOS devices with advanced high-K/metal gate scheme", IEEE International Electron Devices Meeting (IEDM), 2010, pp. 27.1.1-27.1.4.

*Primary Examiner* — Matthew Reames
*Assistant Examiner* — Steven B Gauthier
(74) *Attorney, Agent, or Firm* — Laurence Greenberg; Werner Stemer; Ralph Locher

(57) ABSTRACT

A method for producing a semiconductor device includes a first step of forming a fin-shaped silicon layer on a silicon substrate using a first resist and forming a first insulating film therearound; and a second step of forming a second insulating film around the fin-shaped silicon layer and etching the second insulating film so as to be left on a side wall of the fin-shaped silicon layer, depositing a third insulating film on the first and second insulating films and the fin-shaped silicon layer, depositing a polysilicon thereon, planarizing a surface thereof, and etching back the polysilicon to expose the third insulating film, forming a second resist, etching the second and third insulating films and then etching the fin-shaped silicon layer and the polysilicon, and removing the second insulating film to form a pillar-shaped silicon layer and a dummy gate formed of the polysilicon.

5 Claims, 36 Drawing Sheets

(51) Int. Cl.

| | | |
|---|---|---|
| H01L 29/78 | (2006.01) | |
| H01L 29/10 | (2006.01) | |
| H01L 29/423 | (2006.01) | |
| H01L 21/28 | (2006.01) | |
| H01L 21/306 | (2006.01) | |
| H01L 21/308 | (2006.01) | |
| H01L 21/311 | (2006.01) | |
| H01L 21/321 | (2006.01) | |
| H01L 21/3213 | (2006.01) | |
| H01L 29/40 | (2006.01) | |

(52) U.S. Cl.
CPC ..... *H01L 21/32133* (2013.01); *H01L 29/1037* (2013.01); *H01L 29/401* (2013.01); *H01L 29/4238* (2013.01); *H01L 29/42356* (2013.01); *H01L 29/42372* (2013.01); *H01L 29/42376* (2013.01); *H01L 29/66545* (2013.01); *H01L 29/66666* (2013.01); *H01L 29/66787* (2013.01); *H01L 29/66795* (2013.01); *H01L 29/7827* (2013.01)

(56) References Cited

U.S. PATENT DOCUMENTS

| | | | |
|---|---|---|---|
| 8,466,512 | B2 | 6/2013 | Masuoka et al. |
| 8,486,785 | B2 | 7/2013 | Masuoka et al. |
| 8,497,548 | B2 | 7/2013 | Masuoka et al. |
| 8,609,497 | B2 | 12/2013 | Chung et al. |
| 8,791,028 | B2 | 7/2014 | Okano |
| 2001/0028078 | A1* | 10/2001 | Noble .................... H01L 27/108 257/303 |
| 2009/0189222 | A1* | 7/2009 | Shino ...................... H01L 21/84 257/368 |
| 2009/0256187 | A1* | 10/2009 | Kim ................ H01L 21/823487 257/314 |
| 2010/0207201 | A1* | 8/2010 | Masuoka ............ H01L 27/0207 257/329 |
| 2011/0303973 | A1 | 12/2011 | Masuoka et al. |
| 2014/0206167 | A1 | 7/2014 | Wu et al. |
| 2014/0213025 | A1 | 7/2014 | Masuoka et al. |

* cited by examiner

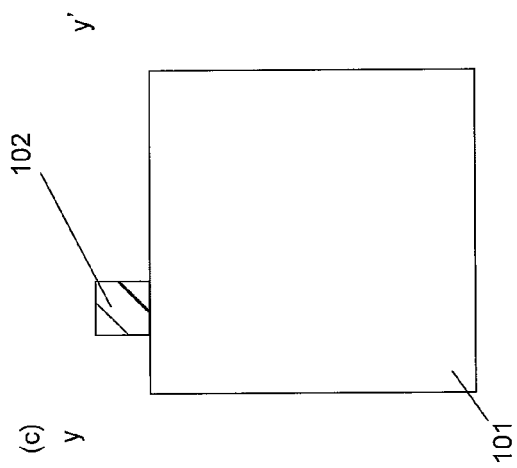
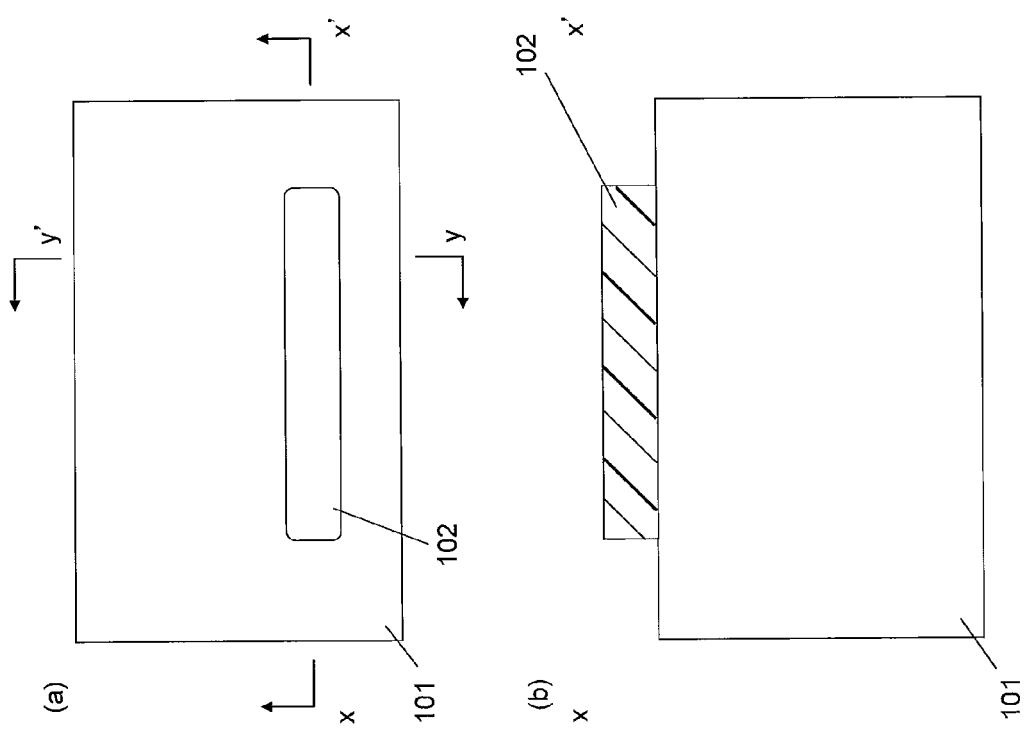
Fig.2

Fig.9
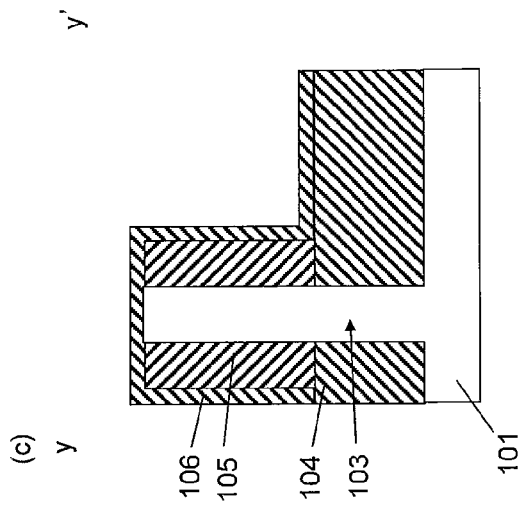
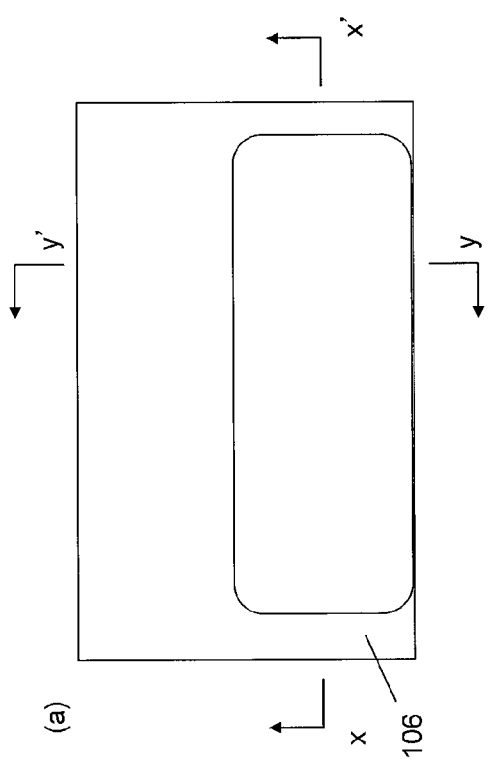
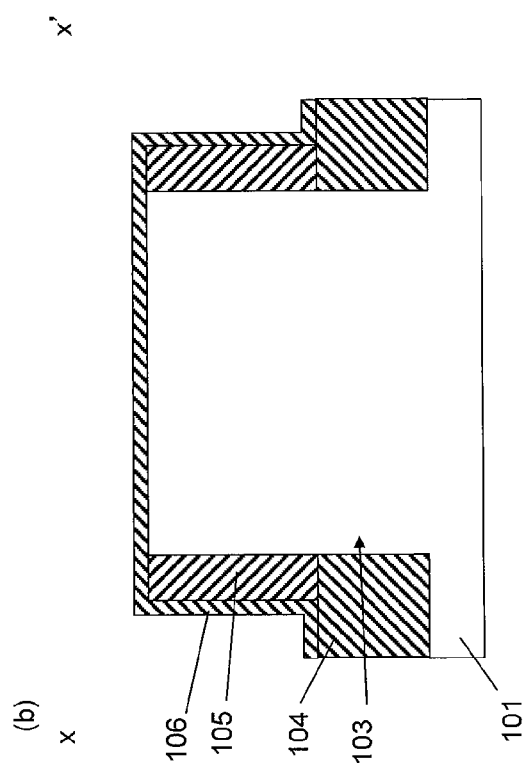

Fig.10
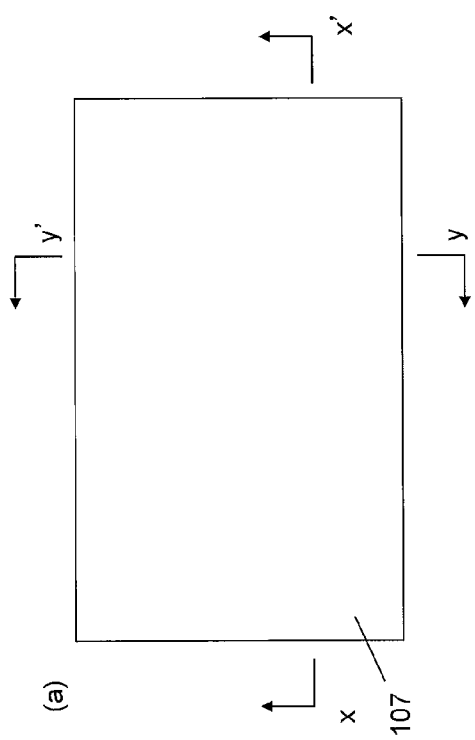
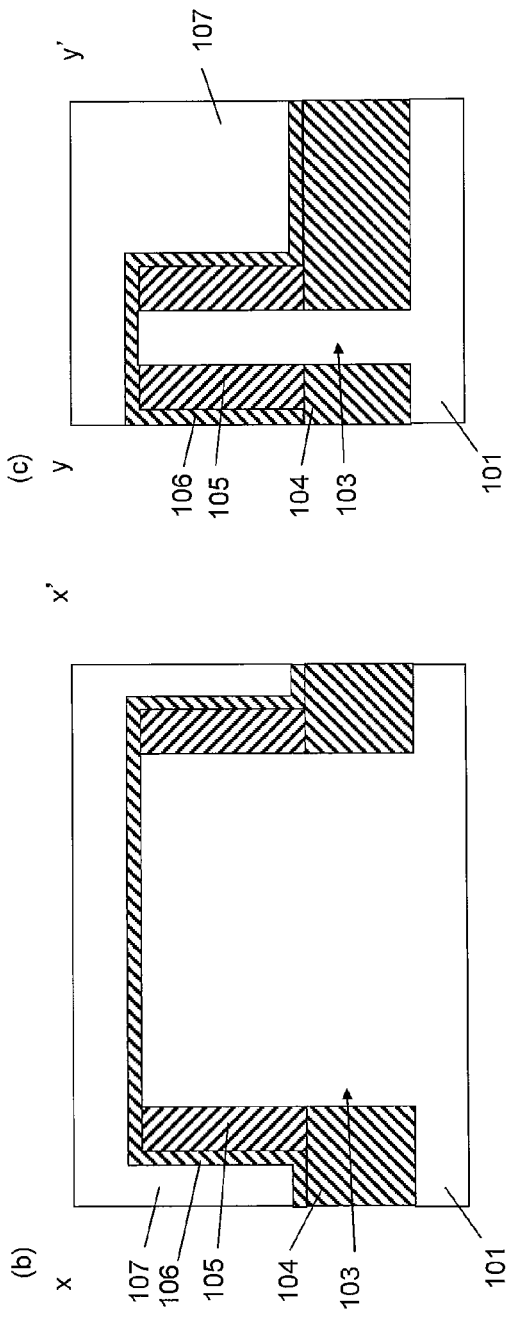

Fig. 12
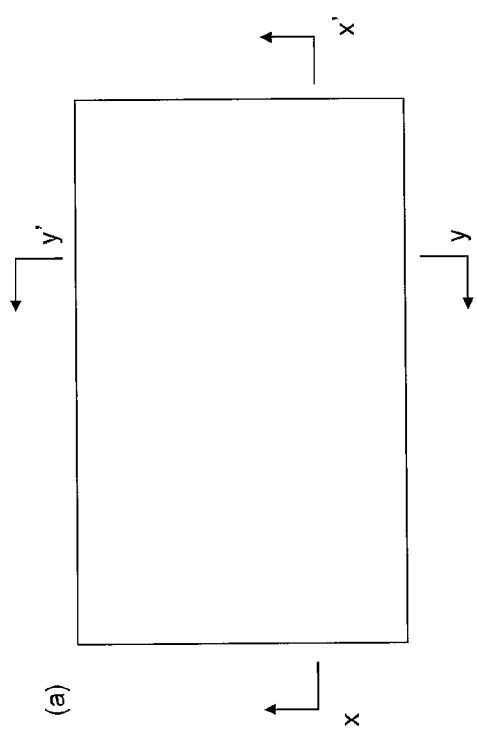
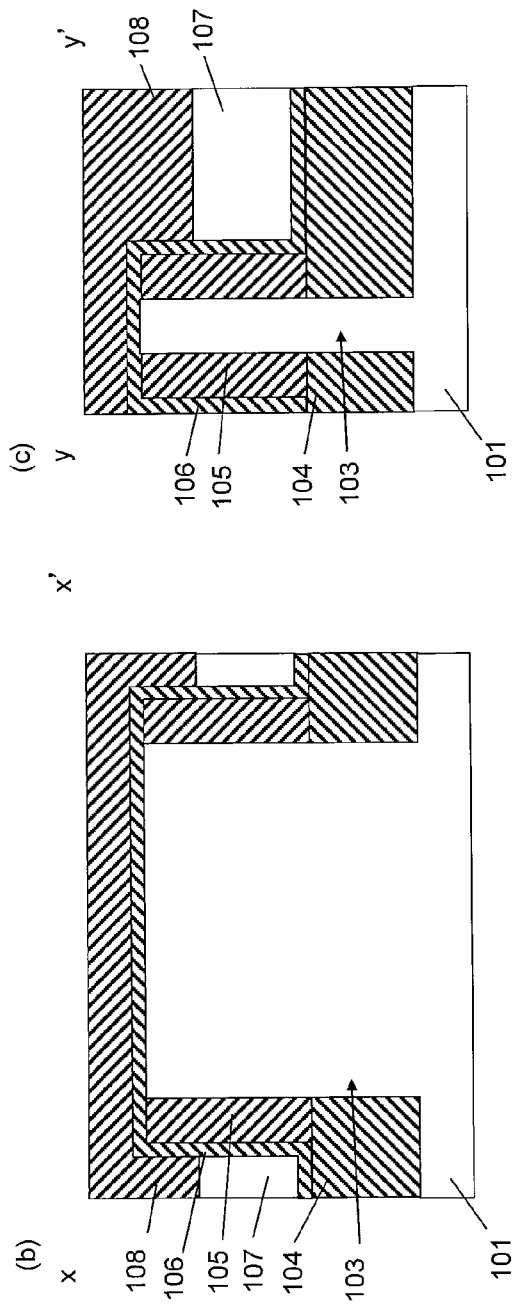

Fig.13
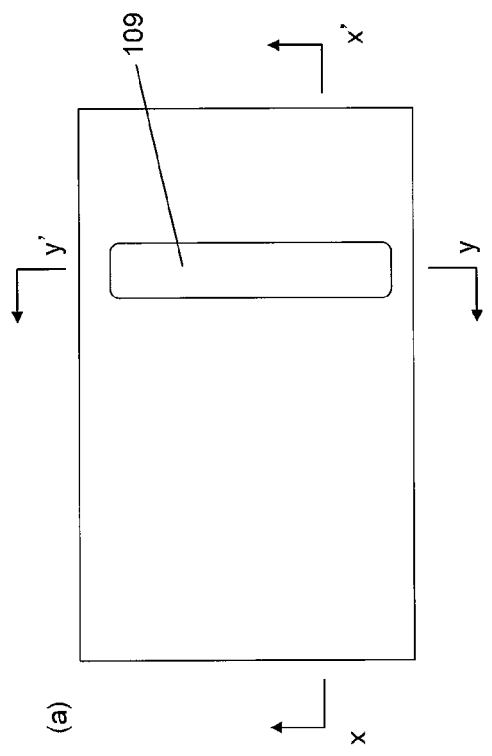
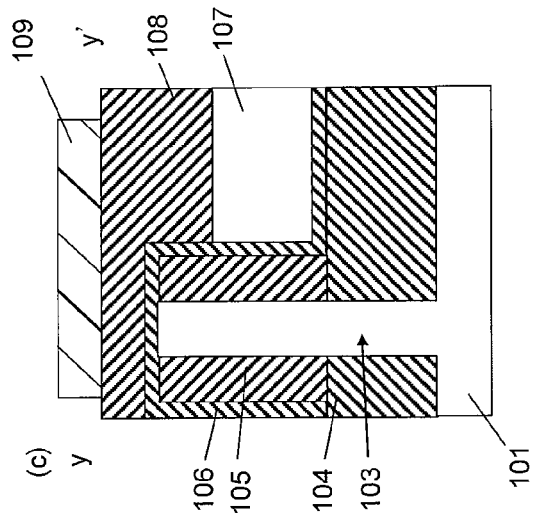
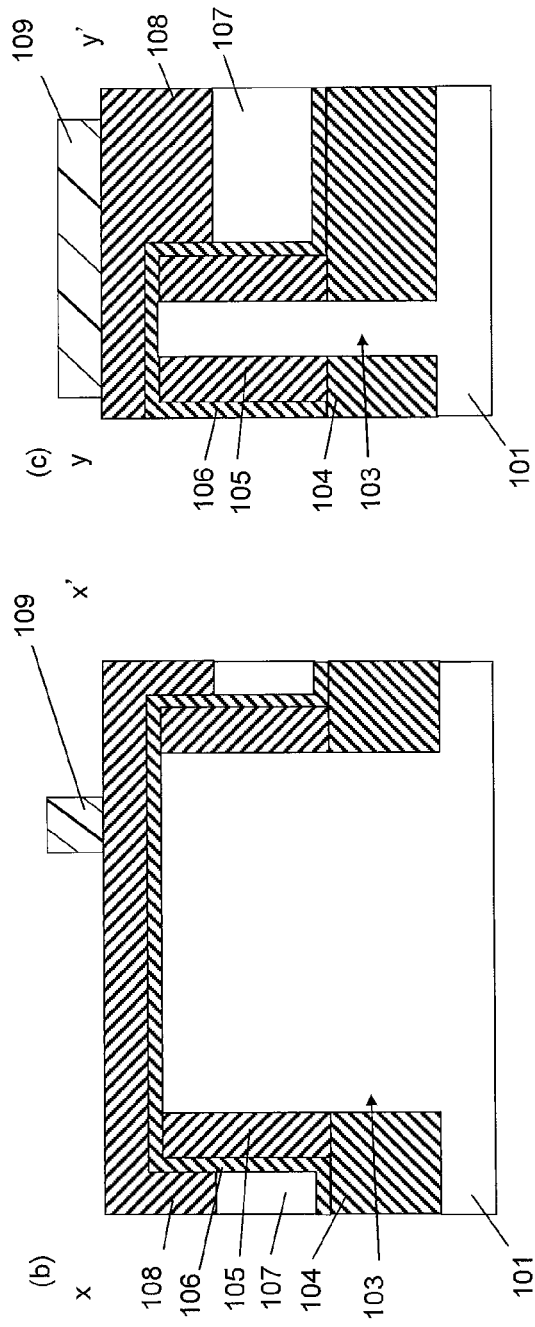

Fig.15
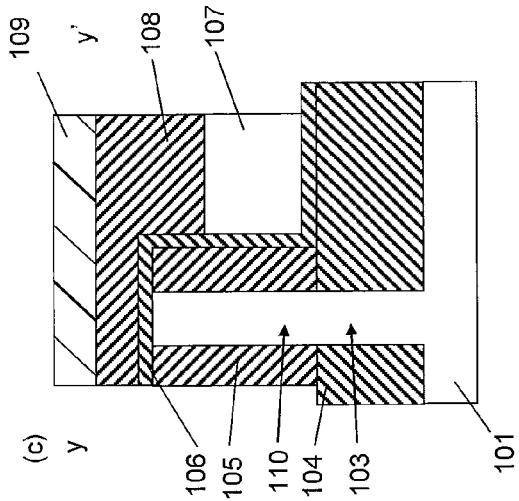
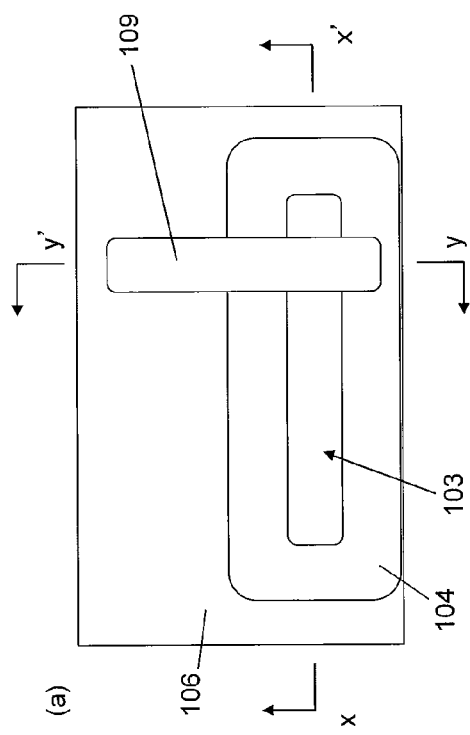
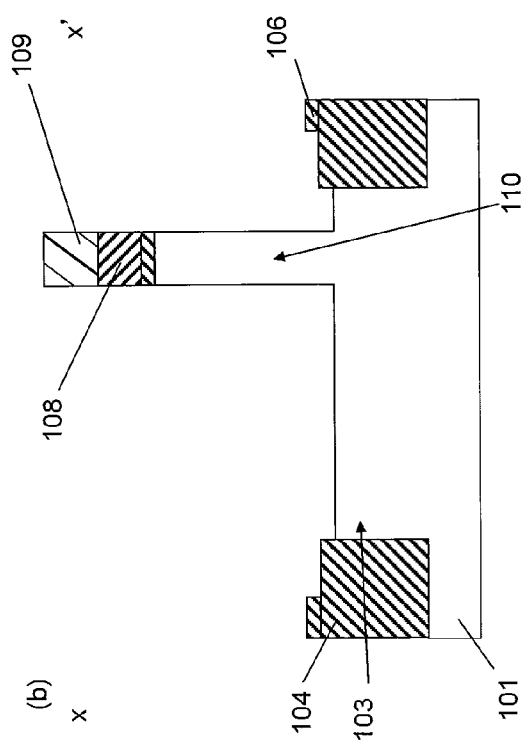

Fig.16
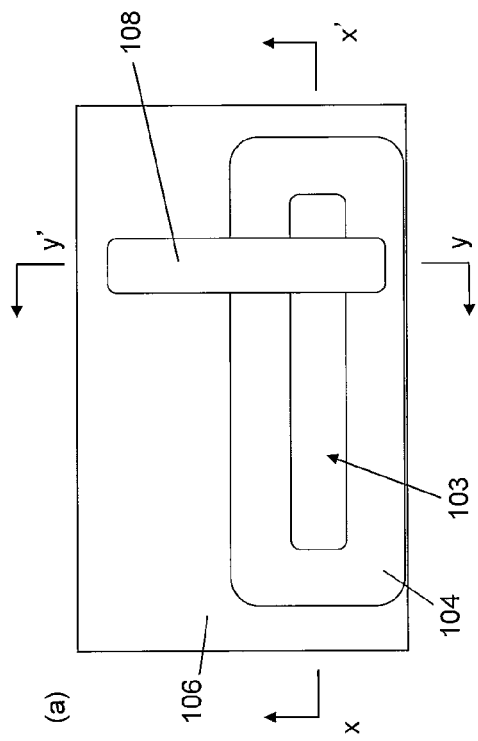
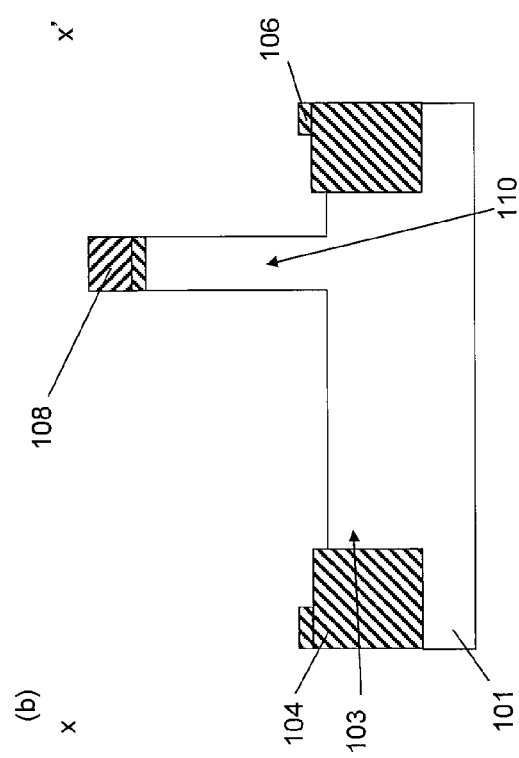
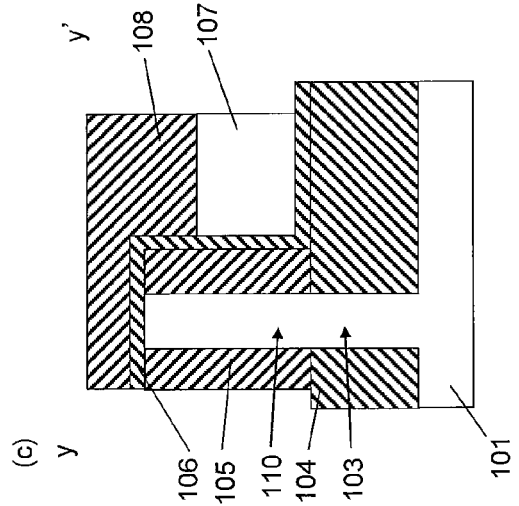

Fig.19
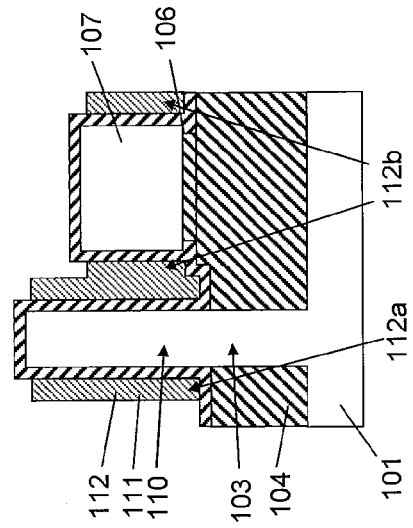
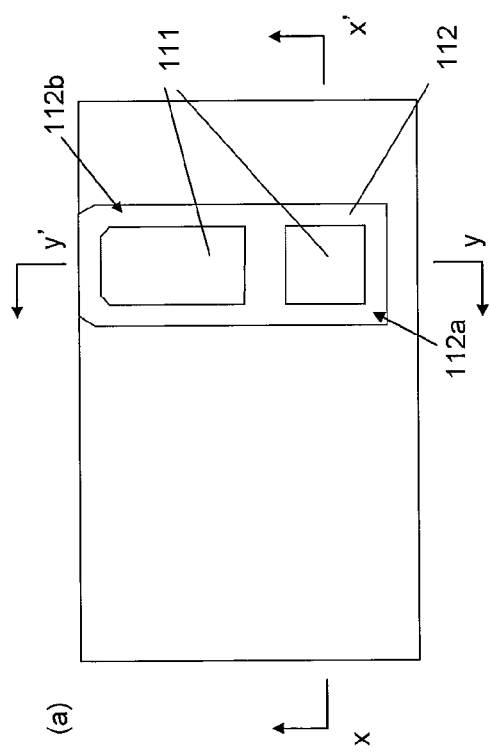
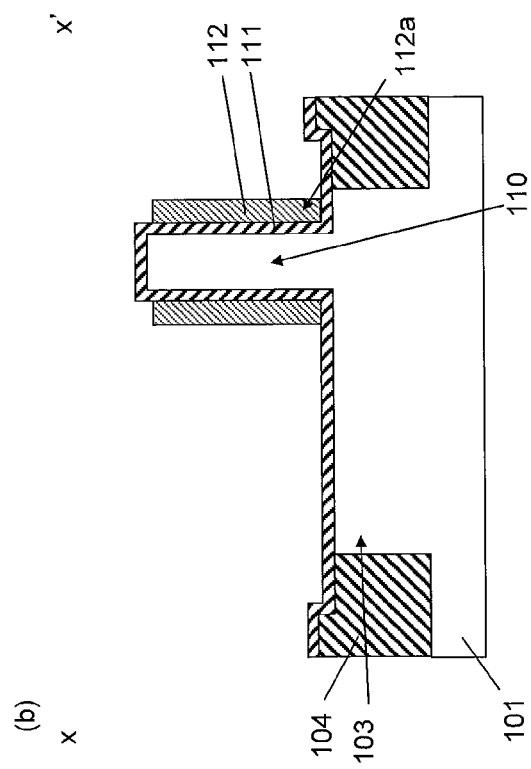

Fig.20
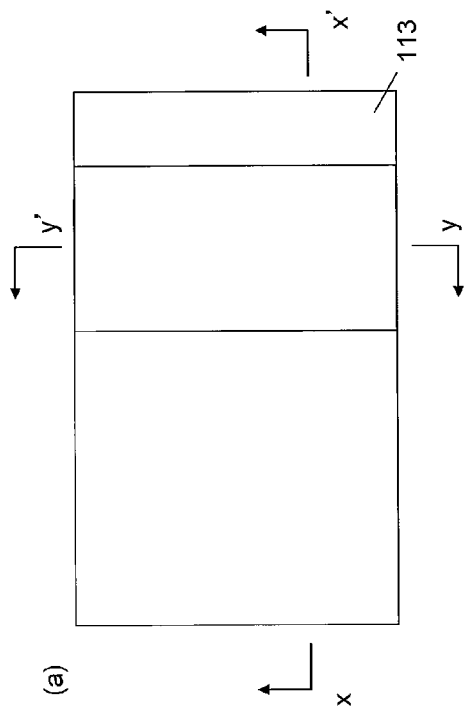
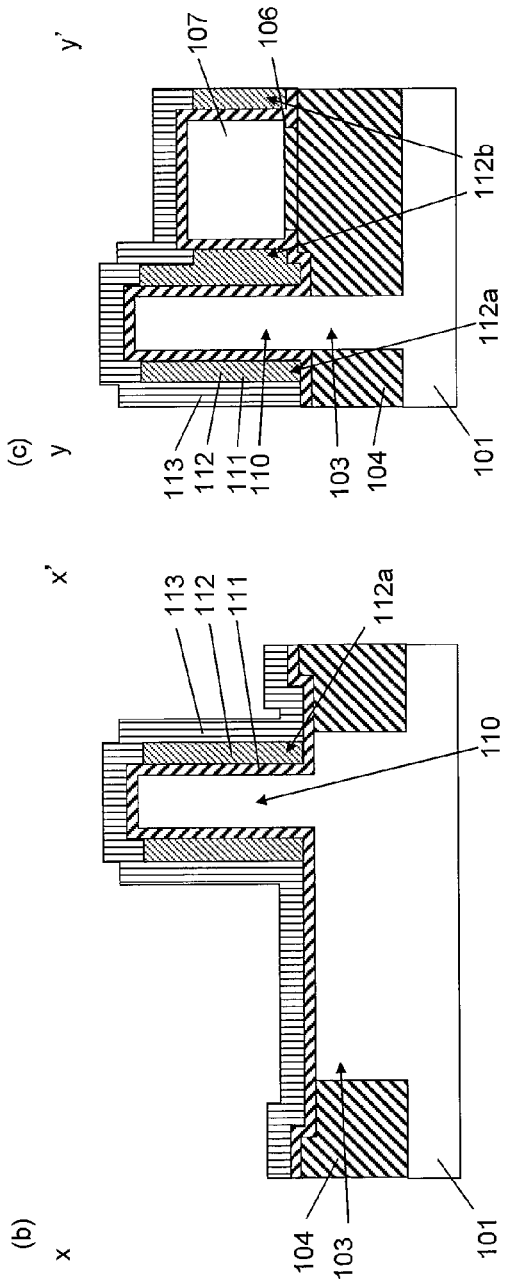

Fig. 21
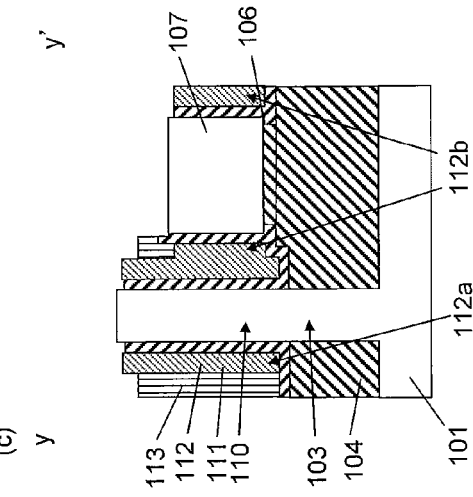
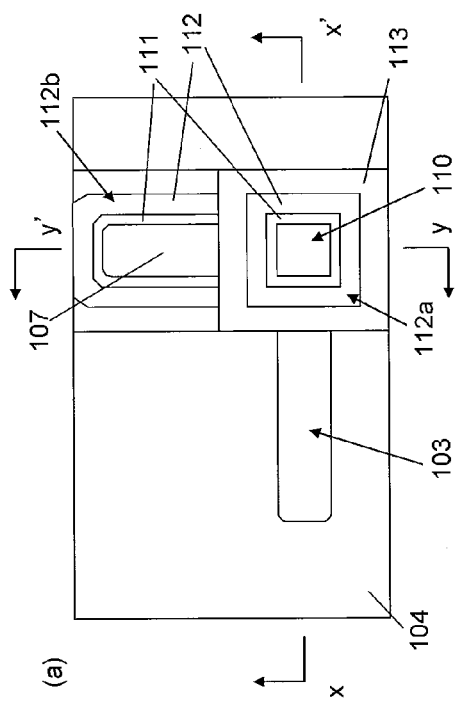
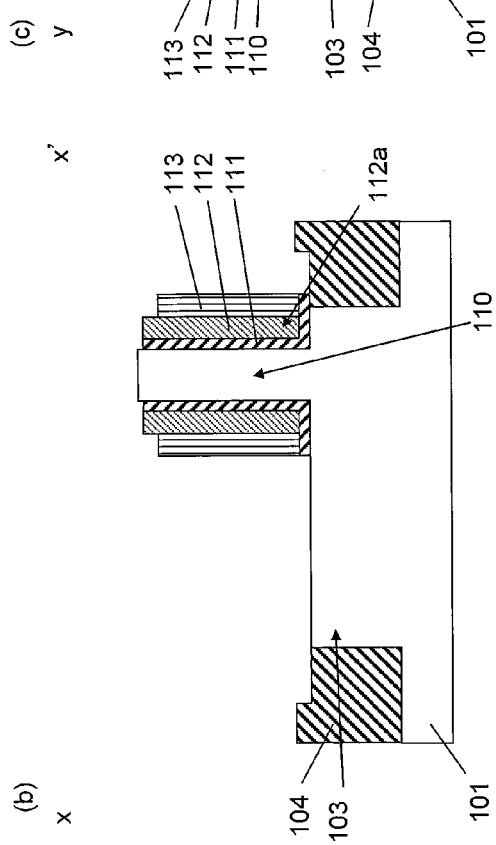

Fig. 24
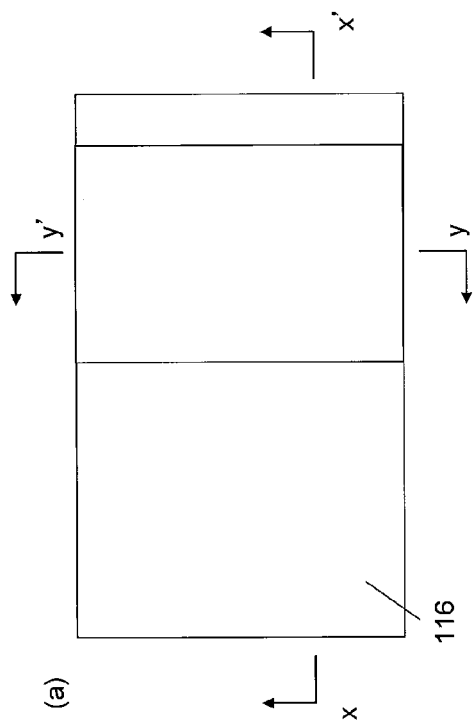
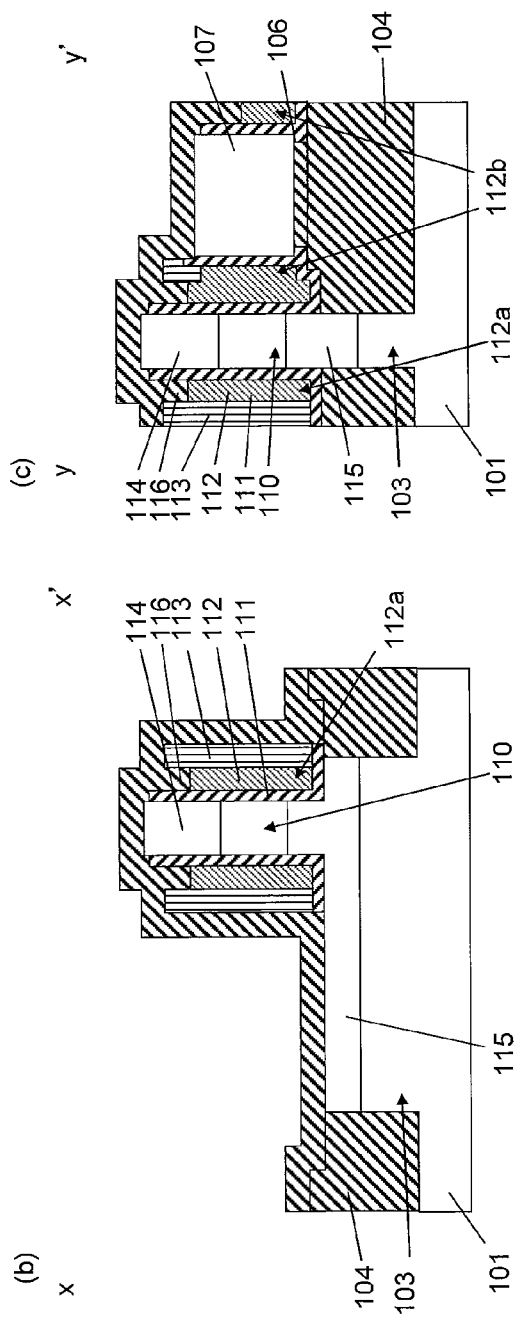

Fig. 26
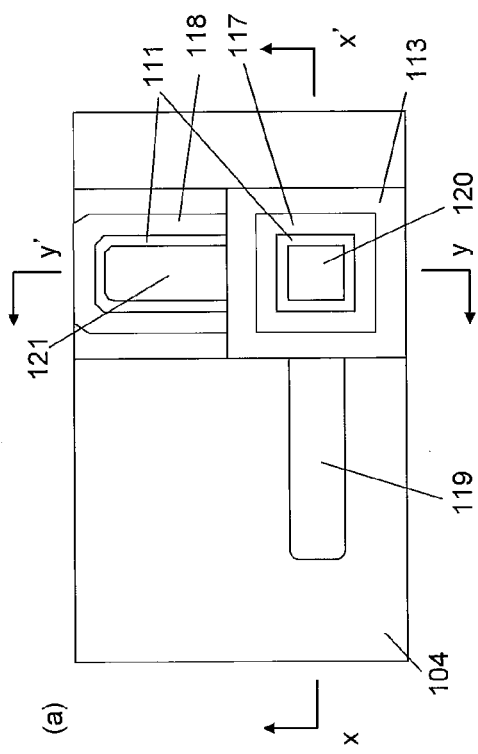
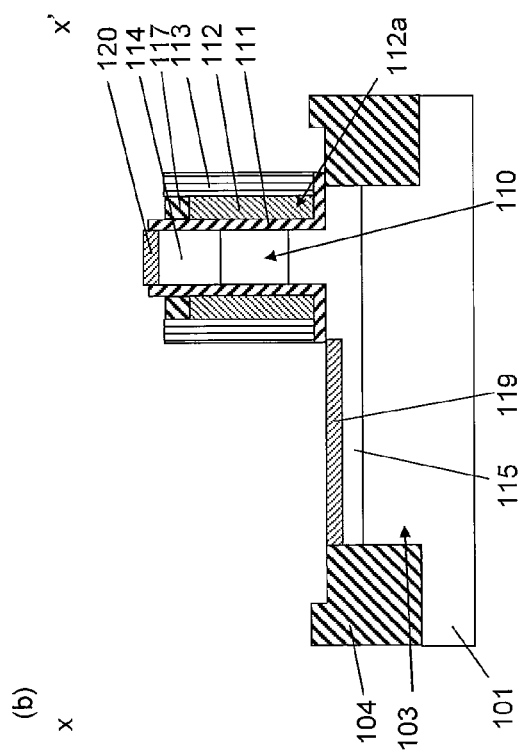
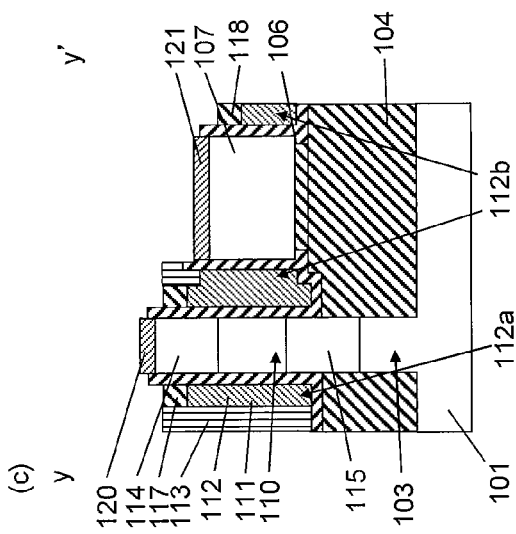

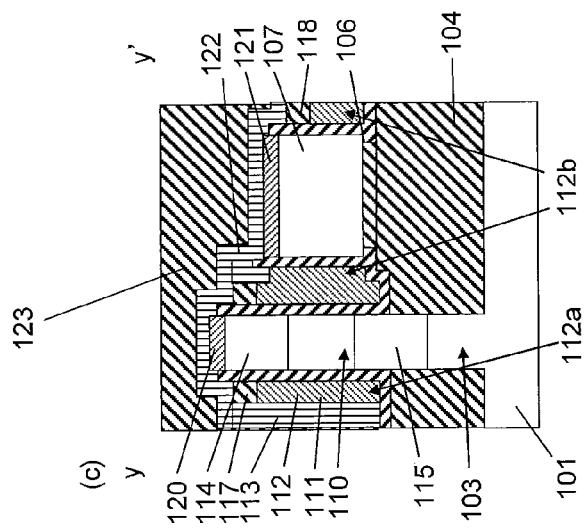
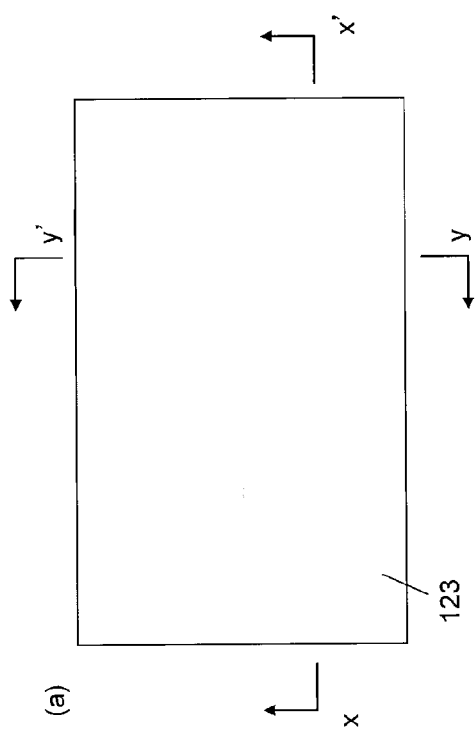
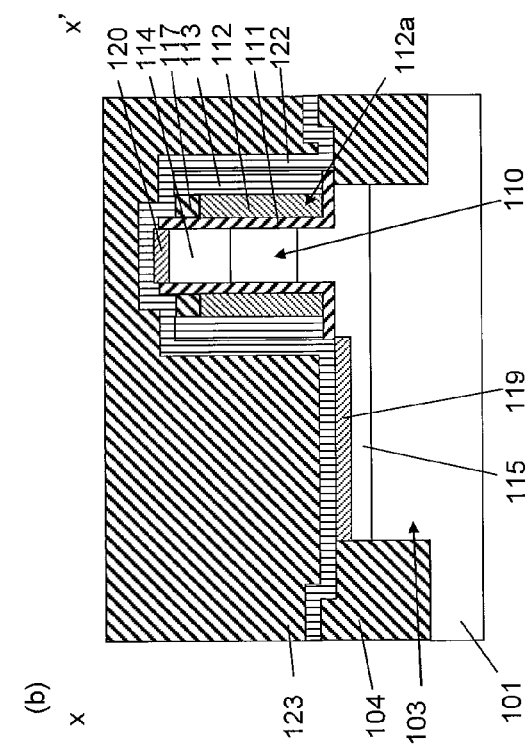
Fig.27

Fig.28
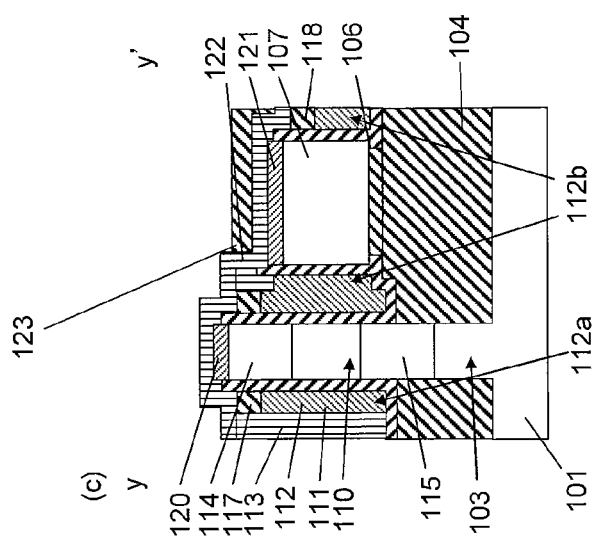
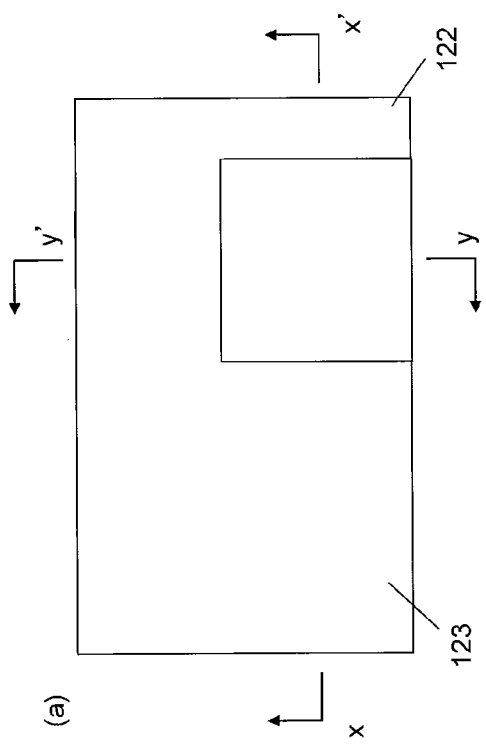
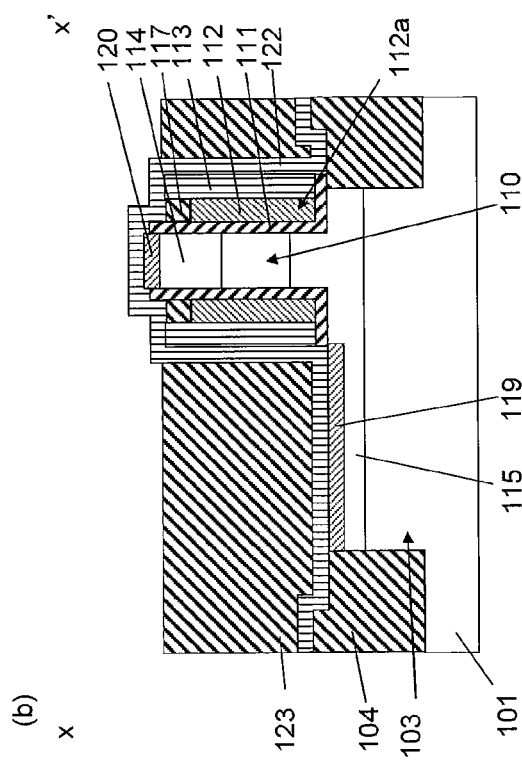

Fig.29
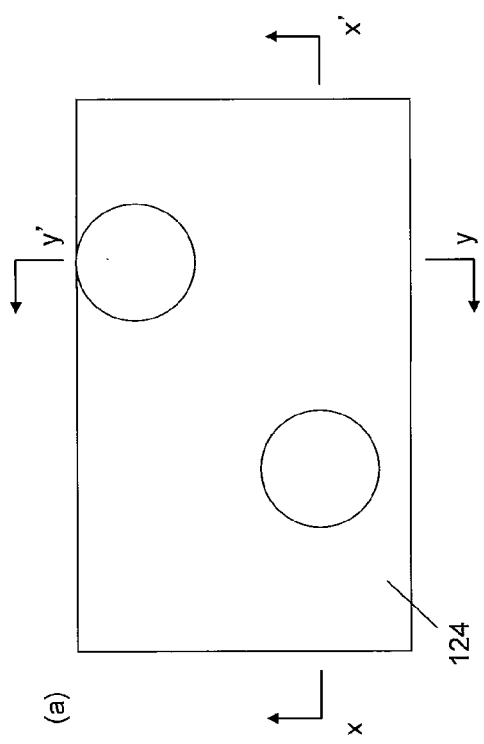
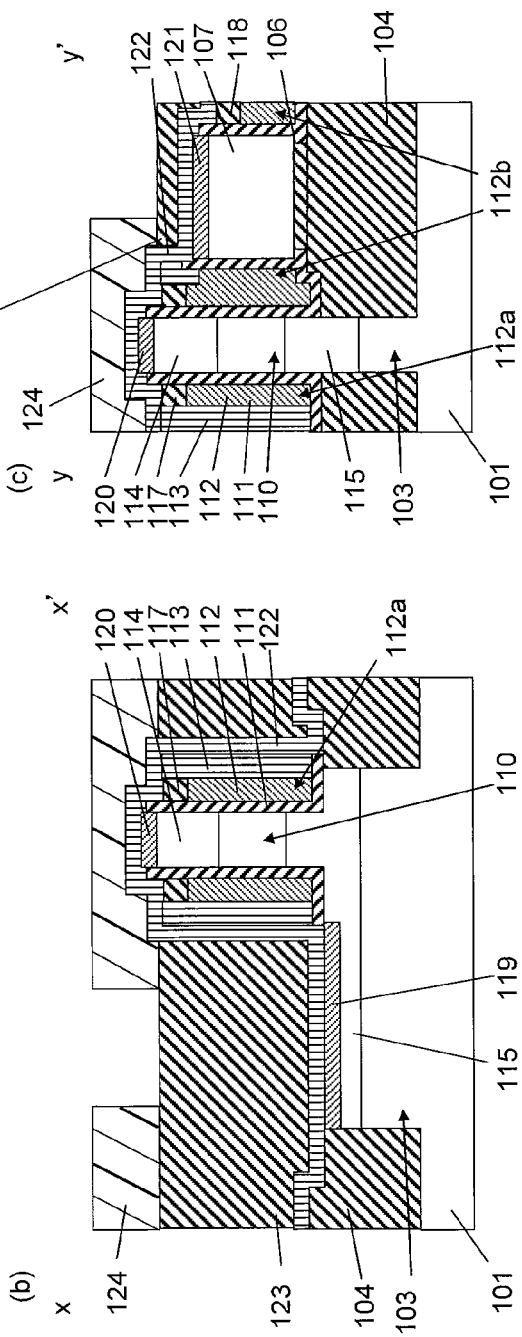

Fig. 30
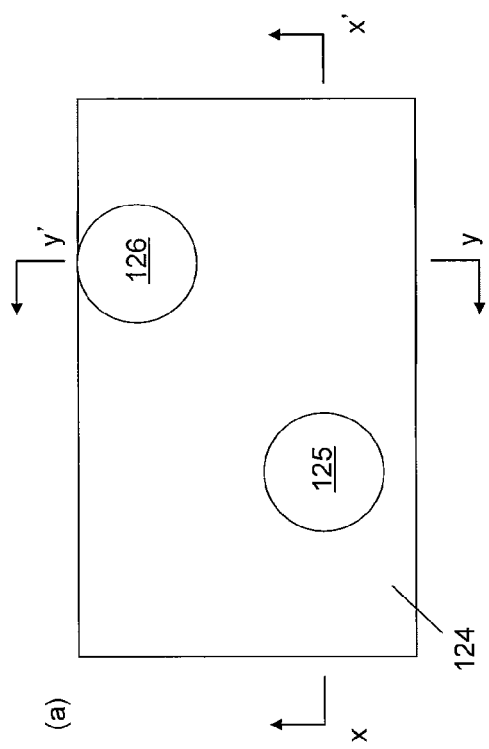
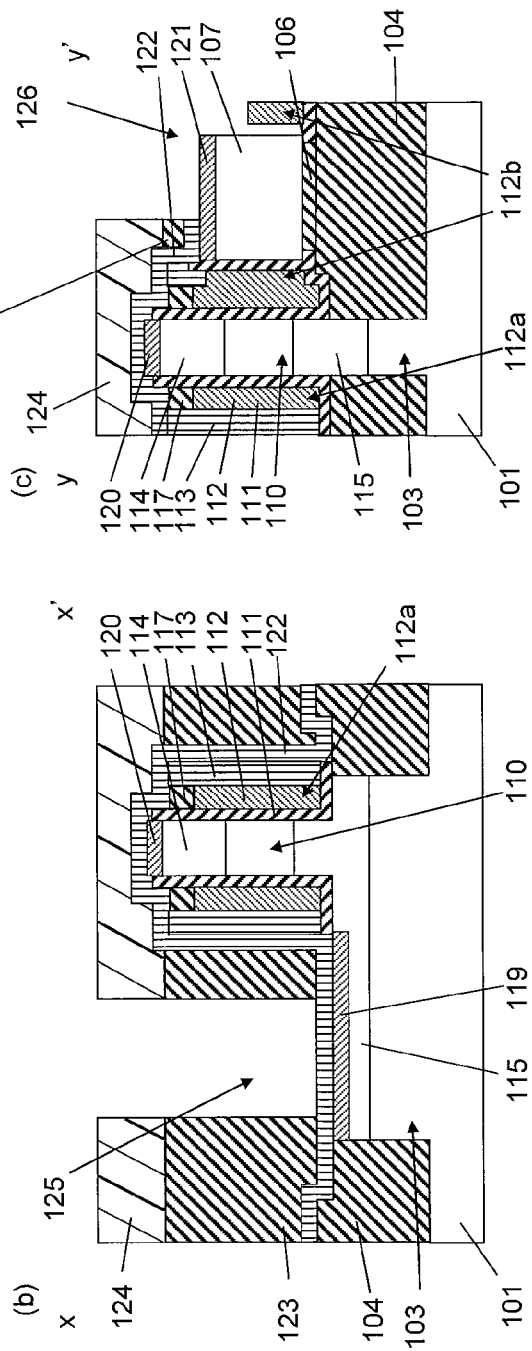

Fig. 31
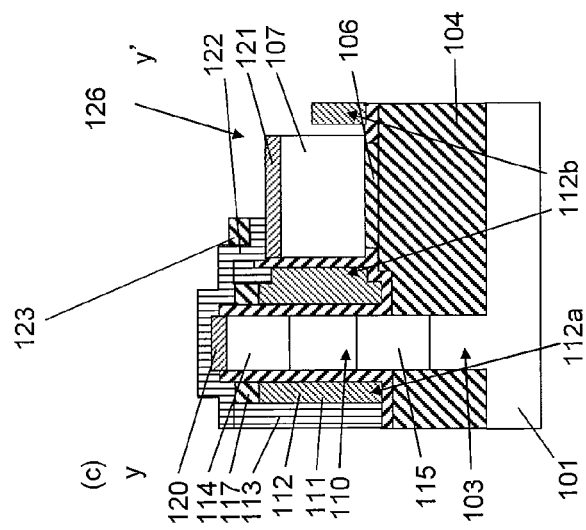
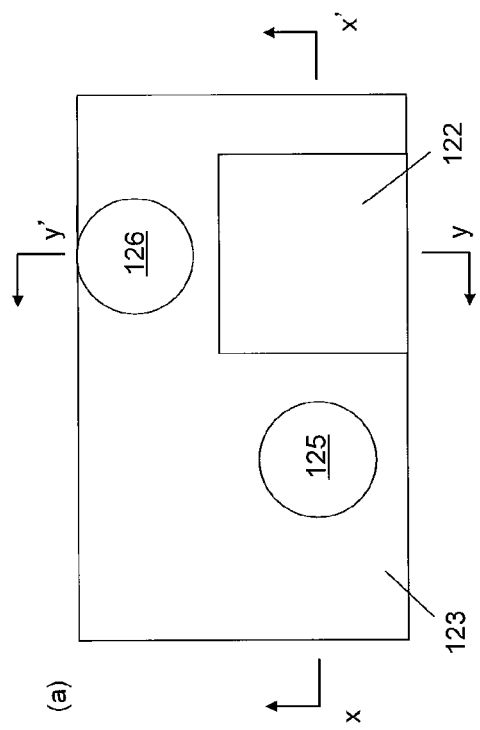
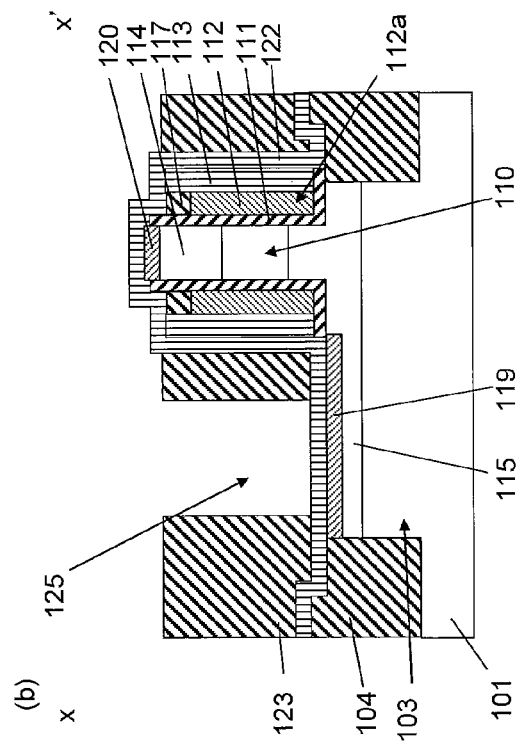

Fig.32
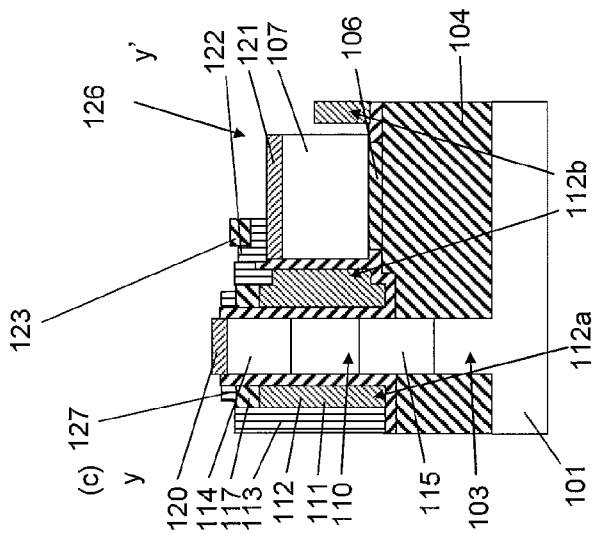
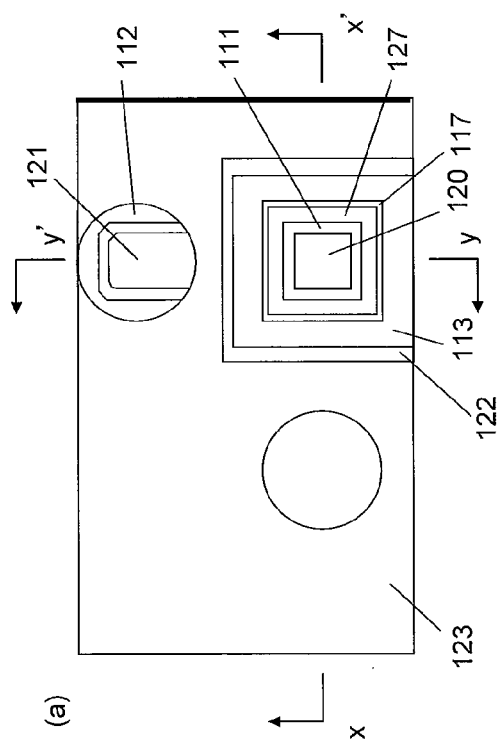
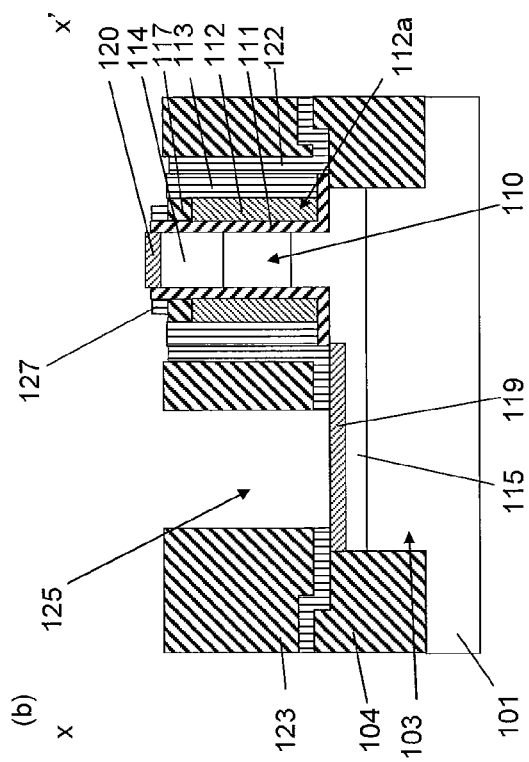

Fig. 33
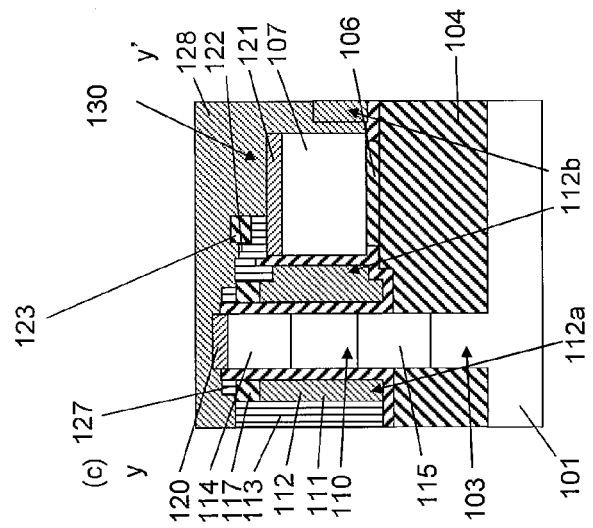
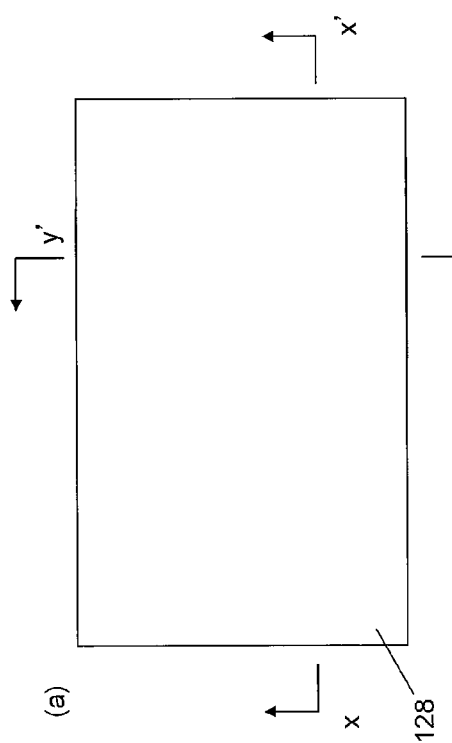
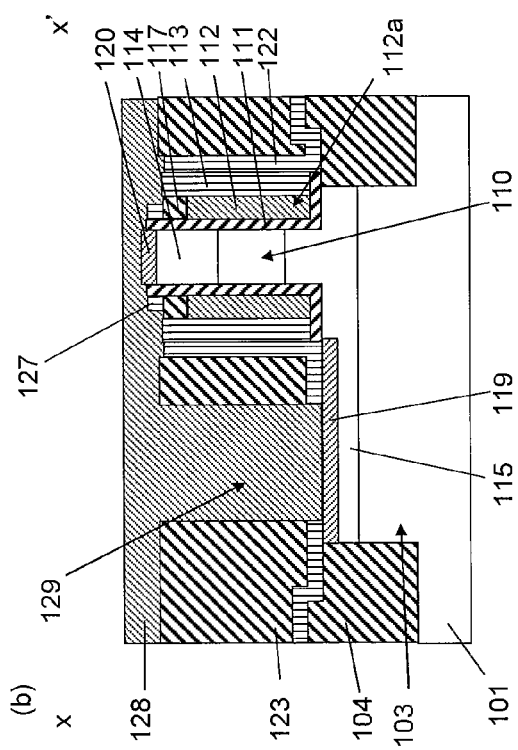

Fig. 34
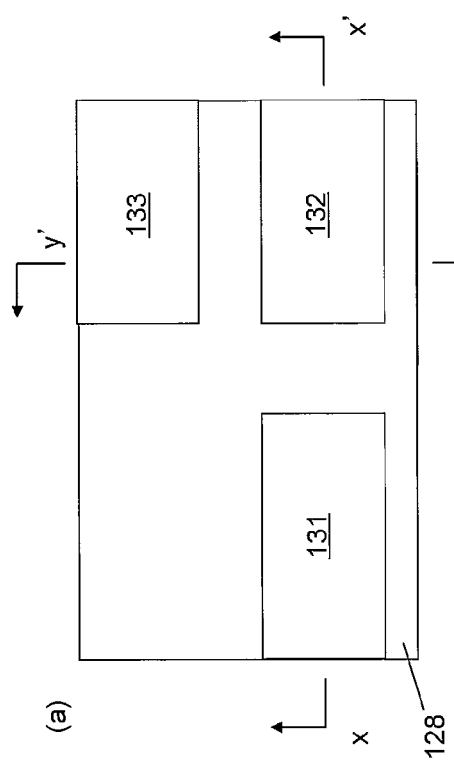
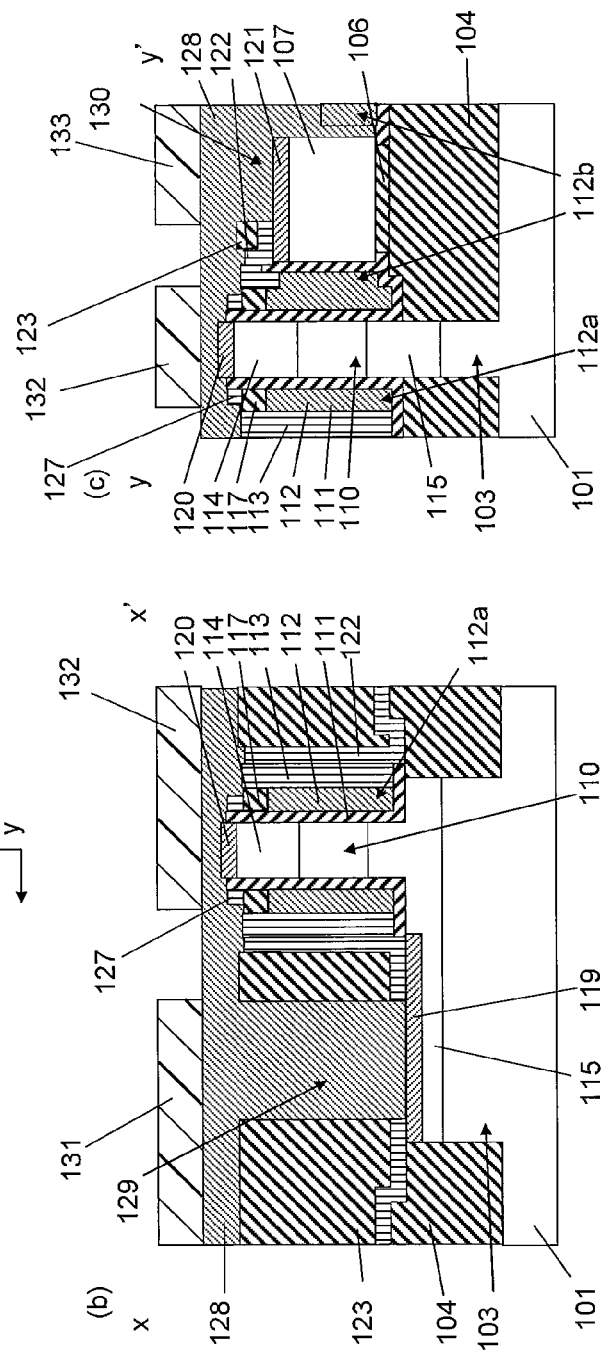

Fig. 35
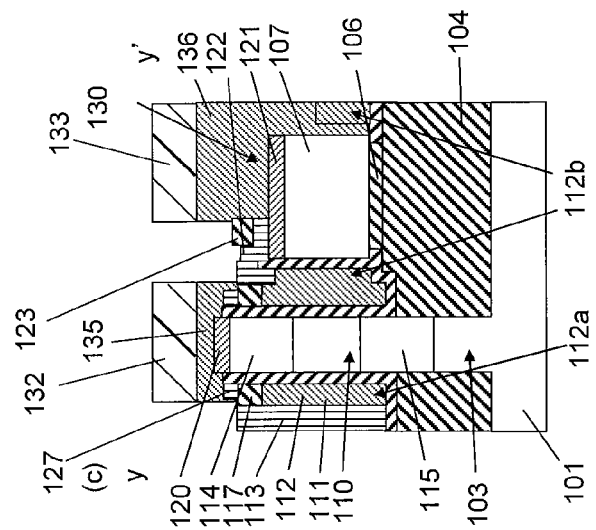
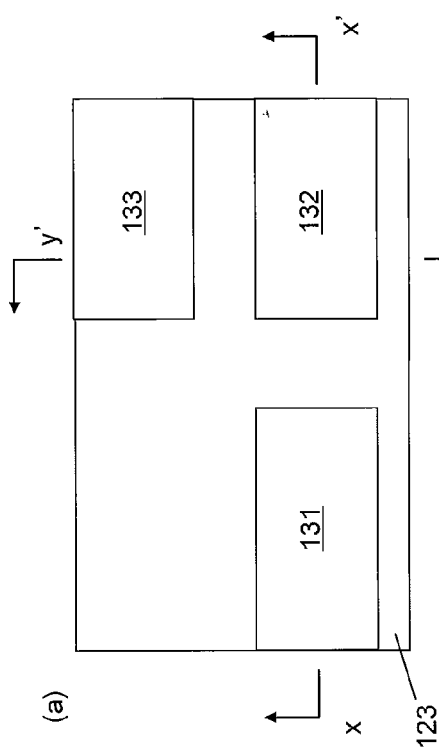
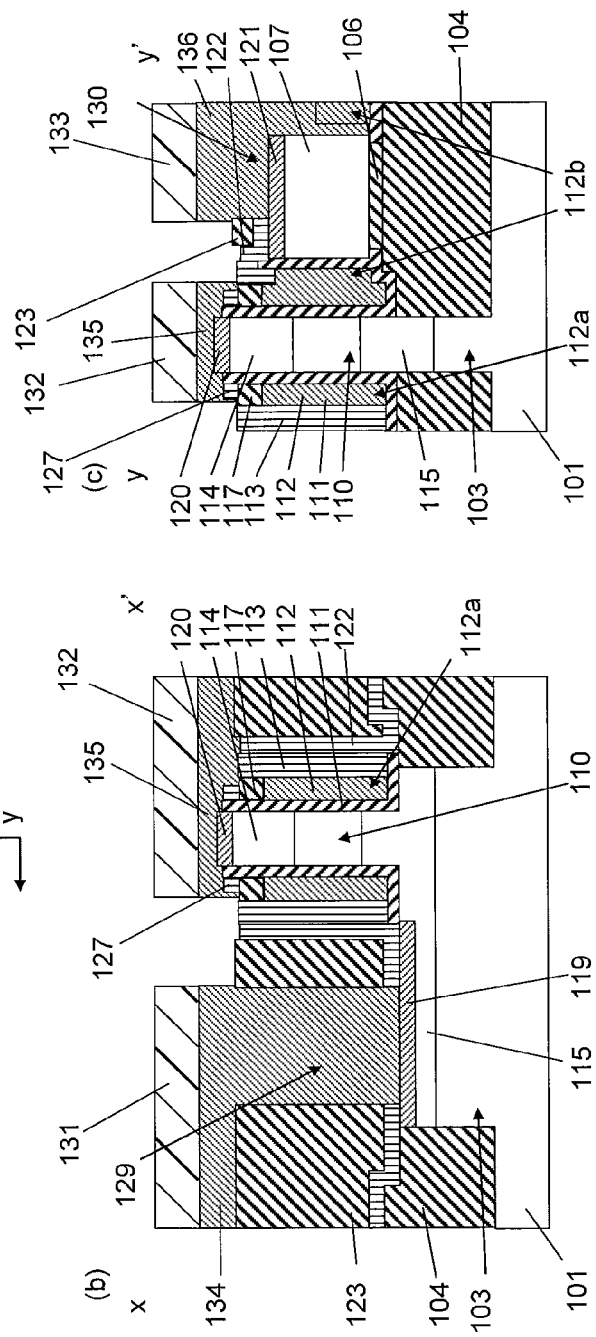

Fig. 36
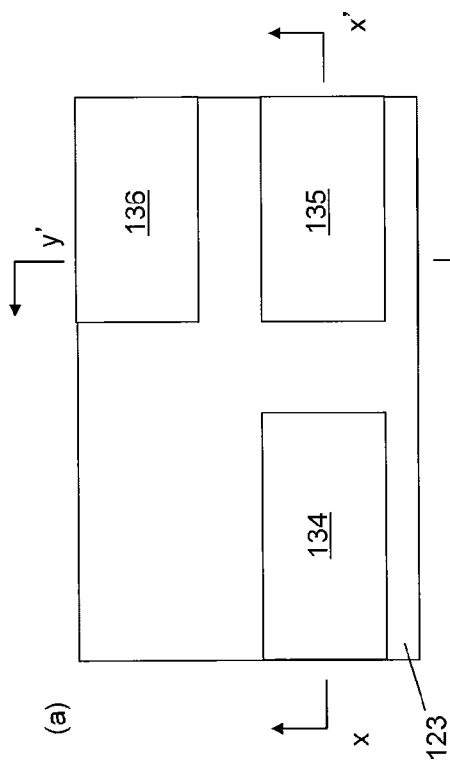
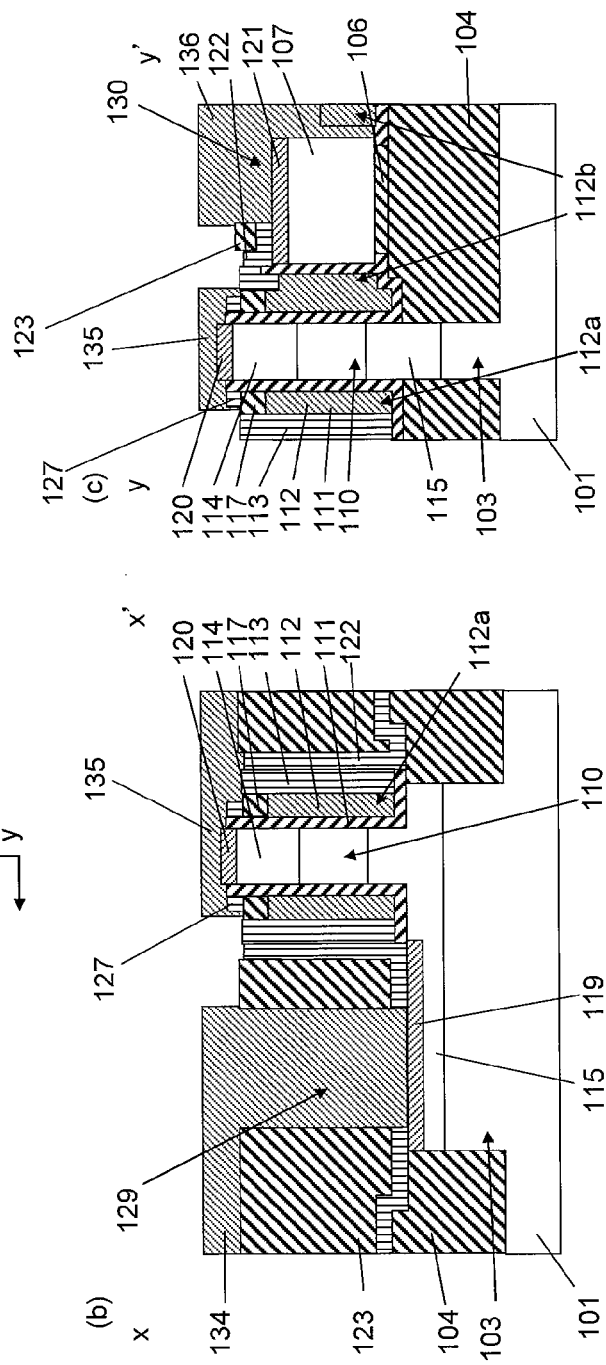

METHOD FOR PRODUCING A SEMICONDUCTOR DEVICE WITH SURROUNDING GATE TRANSISTOR

CROSS REFERENCE TO RELATED APPLICATIONS

This application is a divisional, under 35 U.S.C. §120, of copending patent application Ser. No. 14/074,951, filed Nov. 8, 2013; the application also claims the benefit, under 35 U.S.C. §119(e), of provisional patent application No. 61/725,247, filed on Nov. 12, 2012. The entire content of the prior application is hereby incorporated by reference.

BACKGROUND OF THE INVENTION

1. Field of the Invention

The present invention relates to a method for producing a semiconductor device and a semiconductor device.

2. Description of the Related Art

The degree of integration of semiconductor integrated circuits, in particular, integrated circuits using MOS transistors has been increasing. With this realization of high integration, MOS transistors used in such integrated circuits have been miniaturized to the nano-scale.

With the progress of such miniaturization of MOS transistors, it becomes more difficult to suppress a leak current and it may become more difficult to reduce the area occupied by circuits from the standpoint of the requirement of ensuring a necessary amount of current.

In order to address this problem, a surrounding gate transistor (hereinafter referred to as "SGT") has been proposed in which a source, a gate, and a drain are arranged in a direction perpendicular to a substrate, and a gate electrode surrounds a pillar-shaped semiconductor layer (silicon pillar) (refer to, for example, Japanese Unexamined Patent Application Publication Nos. 2-71556, 2-188966, and 3-145761).

Hitherto, an SGT has been produced as follows. A silicon pillar on which a hard mask composed of a nitride film is formed so as to have a pillar shape is formed by using a first mask for drawing a silicon pillar. Furthermore, a planar silicon layer is formed on a bottom portion of the silicon pillar by using a second mask for drawing a planar silicon layer. Furthermore, a gate line is formed by using a third mask for drawing a gate line (refer to, for example, Japanese Unexamined Patent Application Publication No. 2009-182317). That is, a silicon pillar, a planar silicon layer, and a gate line are formed by using three masks.

SUMMARY OF THE INVENTION

A method for producing a semiconductor device according to a first aspect of the present invention includes a first step of forming a fin-shaped silicon layer on a silicon substrate using a first mask and forming a first insulating film around the fin-shaped silicon layer; and a second step of forming a second insulating film around the fin-shaped silicon layer and etching the second insulating film so that the second insulating film is left on a side wall of the fin-shaped silicon layer, depositing a third insulating film on the second insulating film, the fin-shaped silicon layer, and the first insulating film, depositing a polysilicon on the third insulating film, planarizing a surface of the polysilicon, and subsequently etching back the polysilicon to thereby expose the third insulating film located on an upper portion of the fin-shaped silicon layer, forming a second resist used for forming a gate line and a pillar-shaped silicon layer so as to extend in a second direction perpendicular to a first direction in which the fin-shaped silicon layer extends, etching the third insulating film and the second insulating film and then etching the fin-shaped silicon layer and the polysilicon by using the second resist as a second mask, and further removing the second insulating film to thereby form the pillar-shaped silicon layer and a dummy gate formed of the polysilicon.

After the polysilicon is deposited on the third insulating film, a surface of the polysilicon is planarized, and the polysilicon is then etched back to thereby expose the third insulating film located on the upper portion of the fin-shaped silicon layer, a fourth insulating film is preferably deposited on the exposed third insulating film.

The method for producing a semiconductor device preferably further includes, after the second step, a third step of forming a gate insulating film, forming a gate conductive film around the gate insulating film, and etching the gate conductive film so that the gate conductive film is left on a side wall of the dummy gate and on a side wall of the pillar-shaped silicon layer to form a gate electrode and a gate line.

The method for producing a semiconductor device preferably further includes, after the third step, a fourth step of depositing a first nitride film, etching the first nitride film so that the first nitride film is left on a side wall of the gate electrode and on a side wall of the gate line and so that an upper portion of the gate conductive film is exposed, and removing the exposed upper portion of the gate conductive film by etching.

The method for producing a semiconductor device preferably further includes, after the fourth step, a fifth step of depositing an interlayer insulating film, planarizing a surface of the interlayer insulating film, and etching back the interlayer insulating film to thereby expose an upper portion of the pillar-shaped silicon layer, subsequently forming a third resist used for forming a first contact, and etching the interlayer insulating film to thereby form a contact hole, depositing a metal material in the contact hole to thereby form the first contact on the fin-shaped silicon layer, and subsequently forming a fourth resist used for forming a metal wiring, and conducting etching to thereby form the metal wiring.

A semiconductor device according to a second aspect of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer and having a width equal to a width of the fin-shaped semiconductor layer; a gate insulating film formed around the pillar-shaped semiconductor layer; a gate electrode formed around the gate insulating film; a gate line connected to the gate electrode, extending in a second direction perpendicular to a first direction in which the fin-shaped semiconductor layer extends, and formed, as a sidewall-shape, on a side wall of a dummy gate formed of a polysilicon; a first diffusion layer formed in an upper portion of the pillar-shaped semiconductor layer; and a second diffusion layer formed over an upper portion of the fin-shaped semiconductor layer and a lower portion of the pillar-shaped semiconductor layer.

According to the present invention, it is possible to provide a method for producing an SGT in which the number of steps necessary for producing an SGT can be reduced, and a structure of an SGT obtained by the method.

is a cross-sectional view taken along line x-x' of part (a), and part (c) is a cross-sectional view taken along line y-y' of part (a).

In FIG. 2, part (a) is a plan view illustrating a method for producing a semiconductor device according to an embodiment of the present invention, part (b) is a cross-sectional view taken along line x-x' of part (a), and part (c) is a cross-sectional view taken along line y-y' of part (a).

Figure 3:
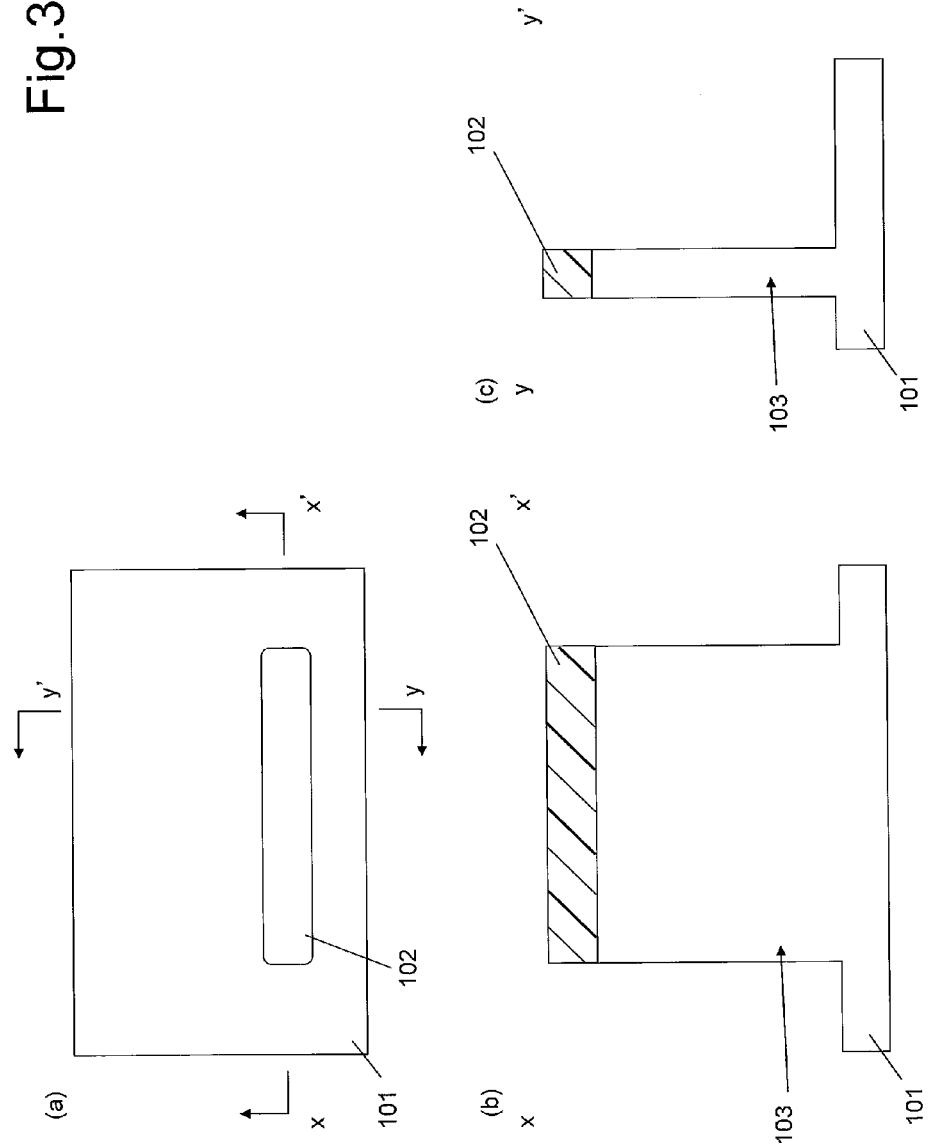

In FIG. 3, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 4:
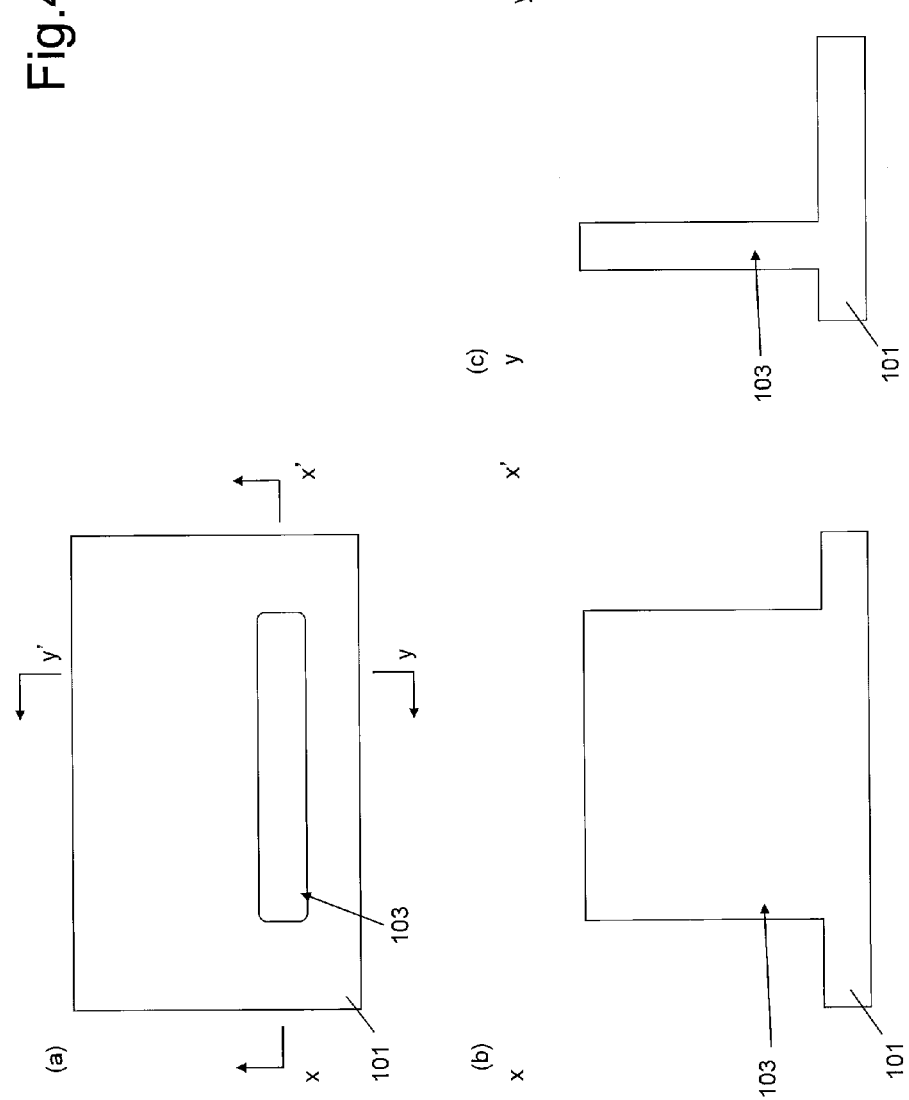

In FIG. 4, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 5:
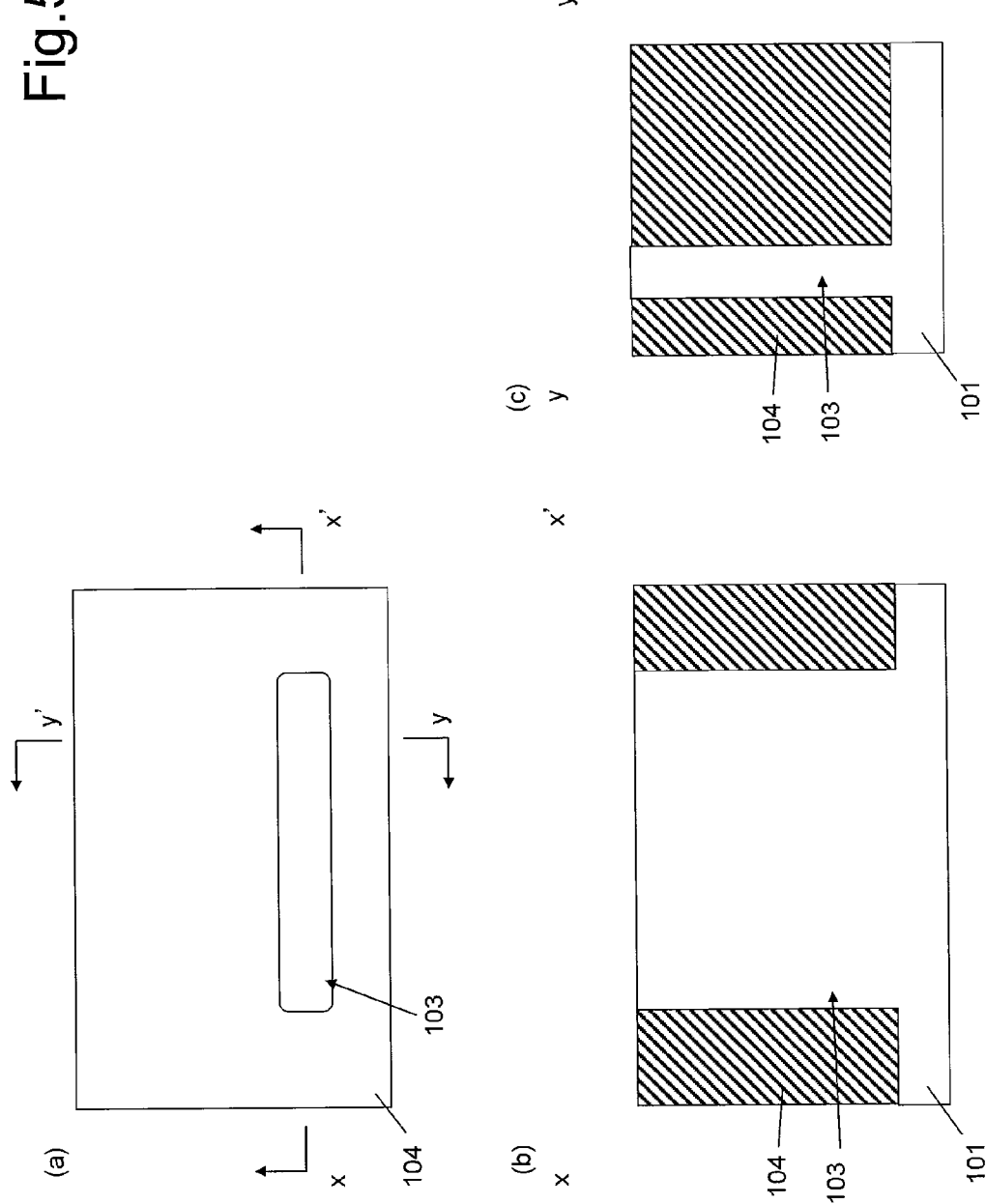

In FIG. 5, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 6:
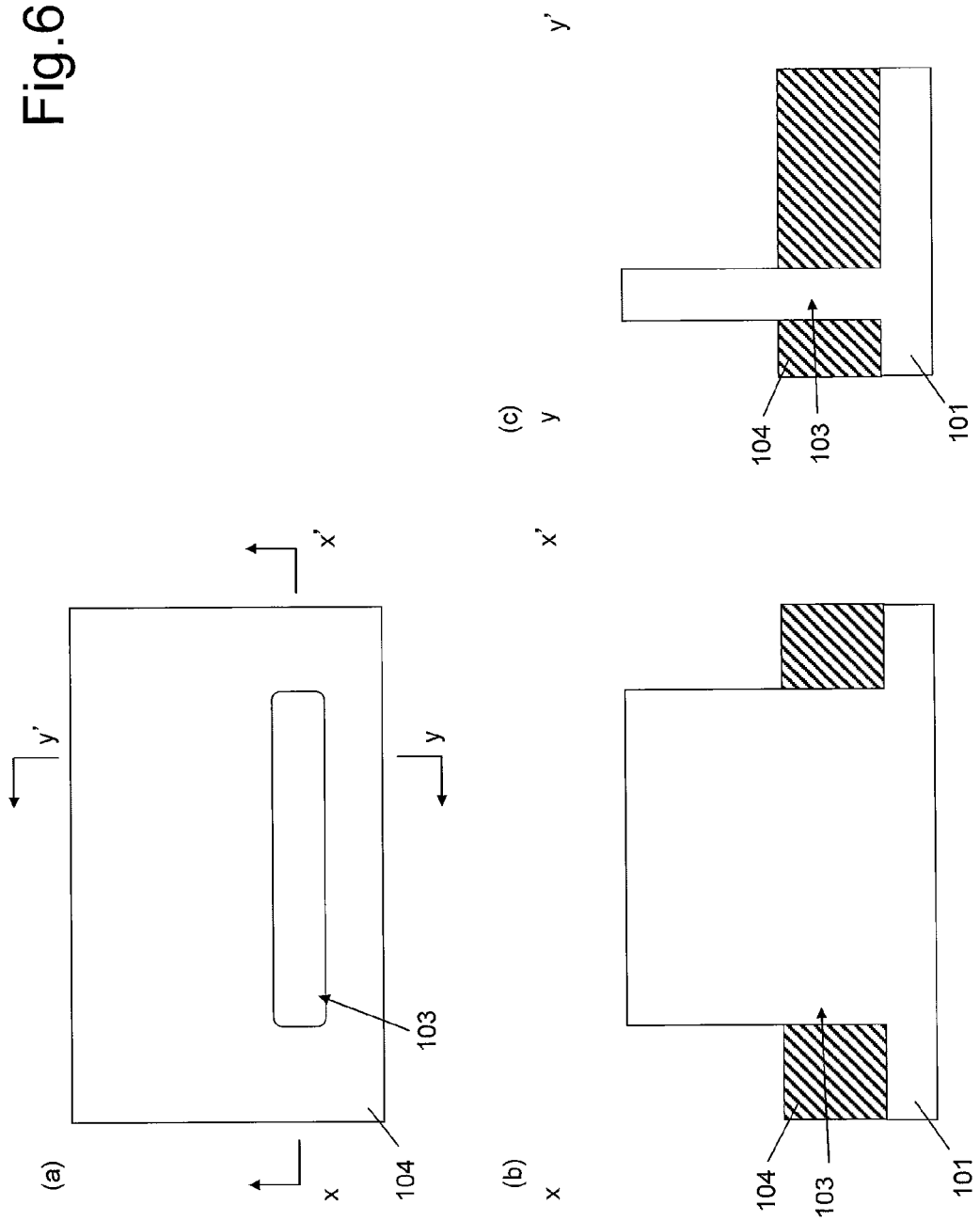

In FIG. 6, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 7:
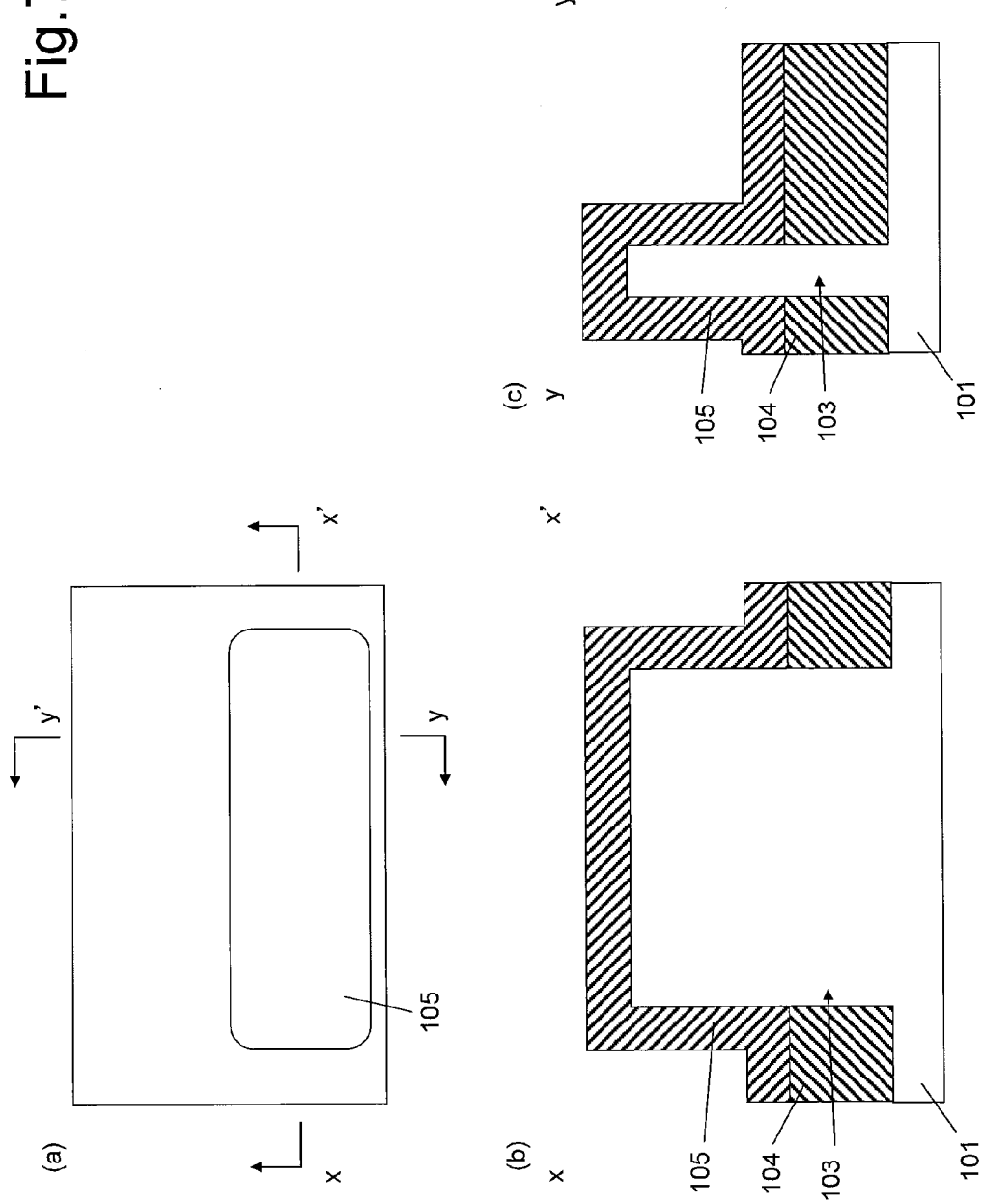

In FIG. 7, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 8:
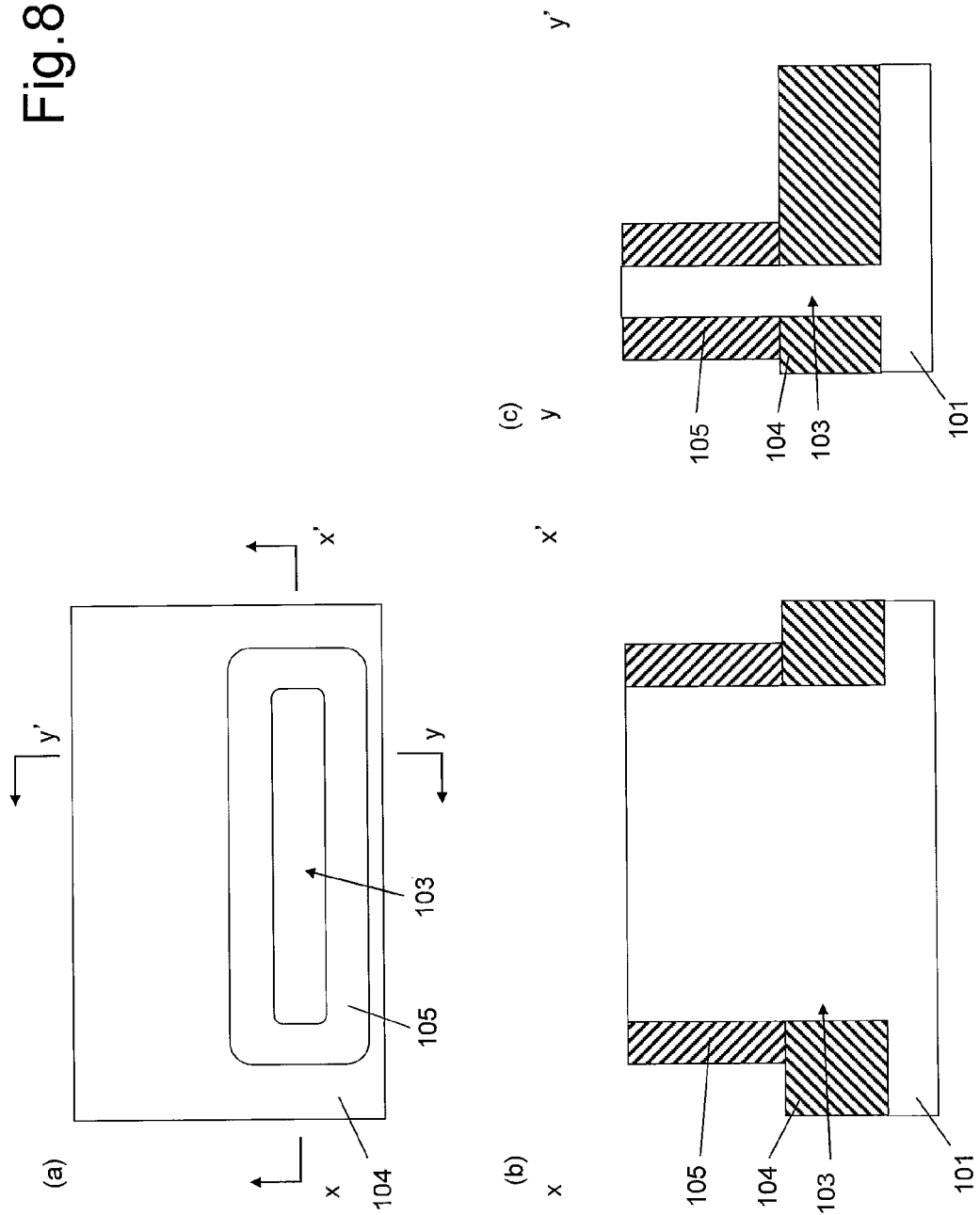

In FIG. 8, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 9, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 10, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 11:
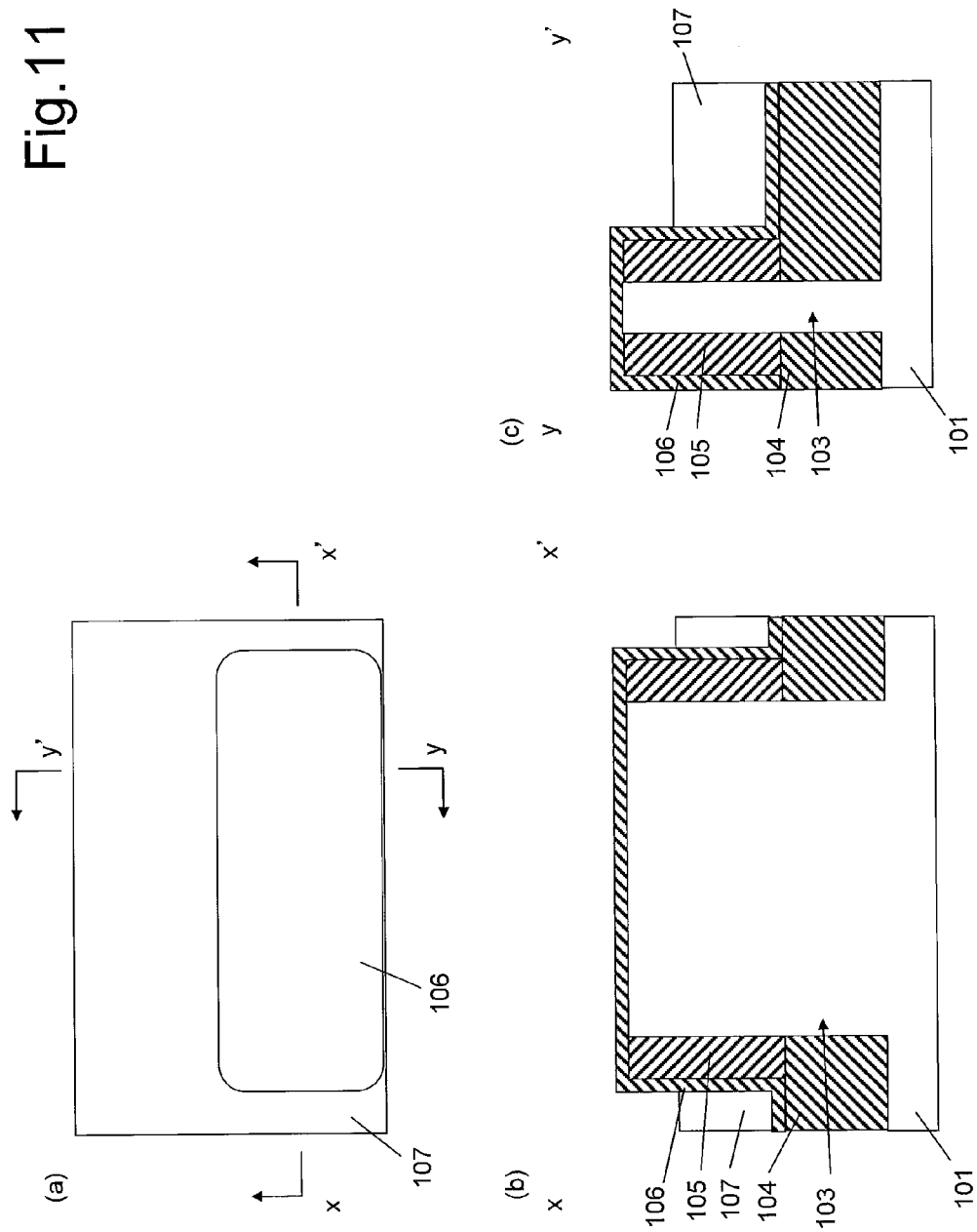

In FIG. 11, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 12, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 13, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 14:
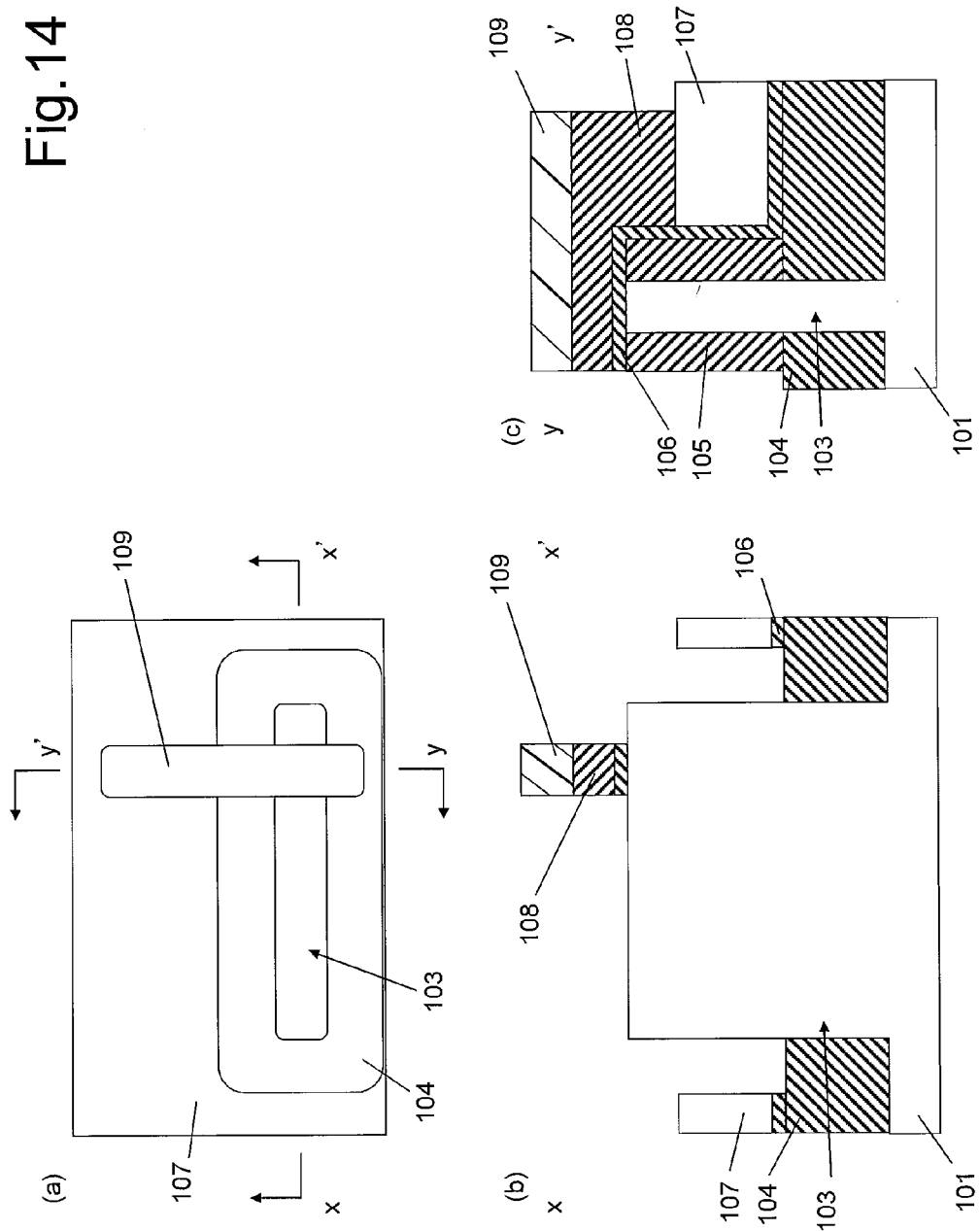

In FIG. 14, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 15, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 16, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 17:
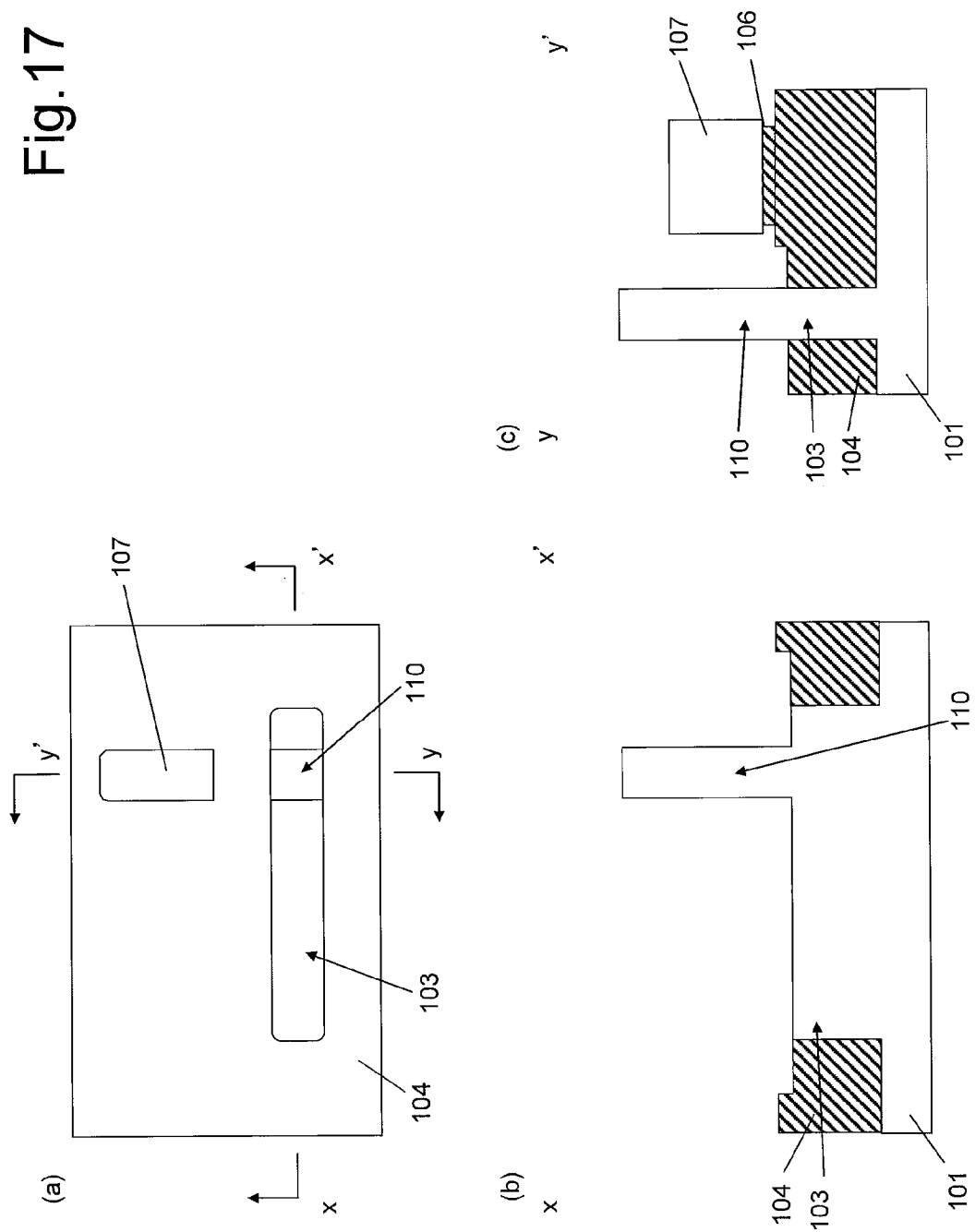

In FIG. 17, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 18:
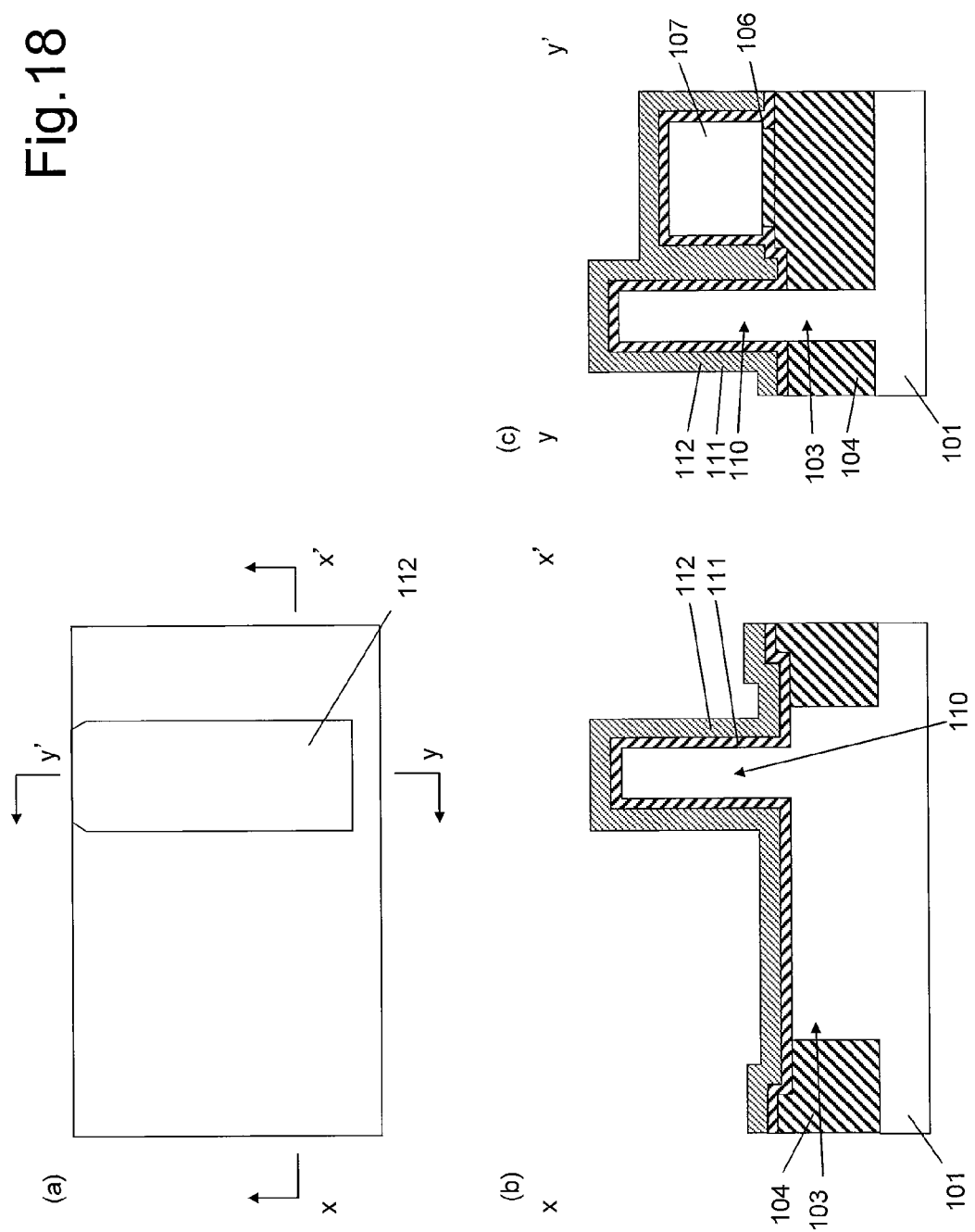

In FIG. 18, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 19, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 20, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 21, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 22:
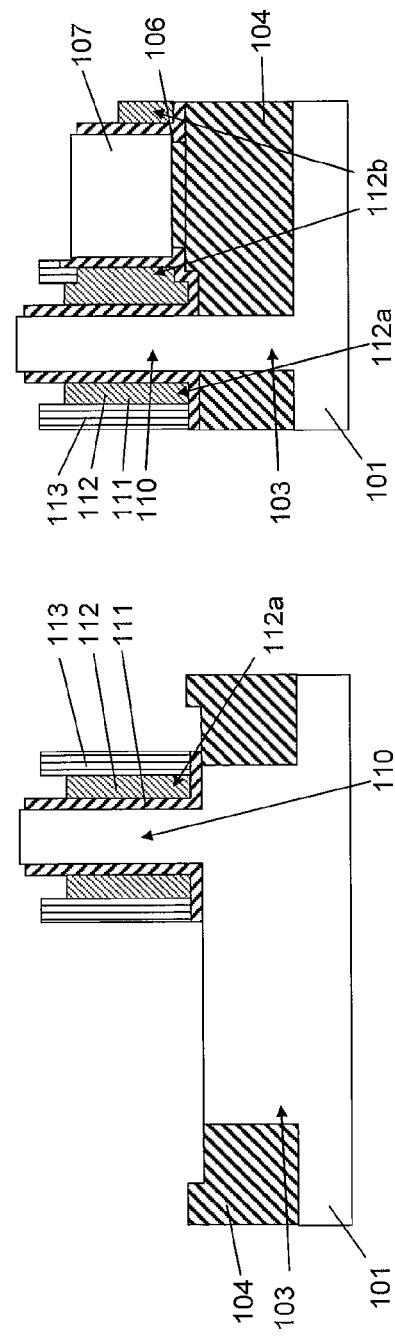

In FIG. 22, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 23:
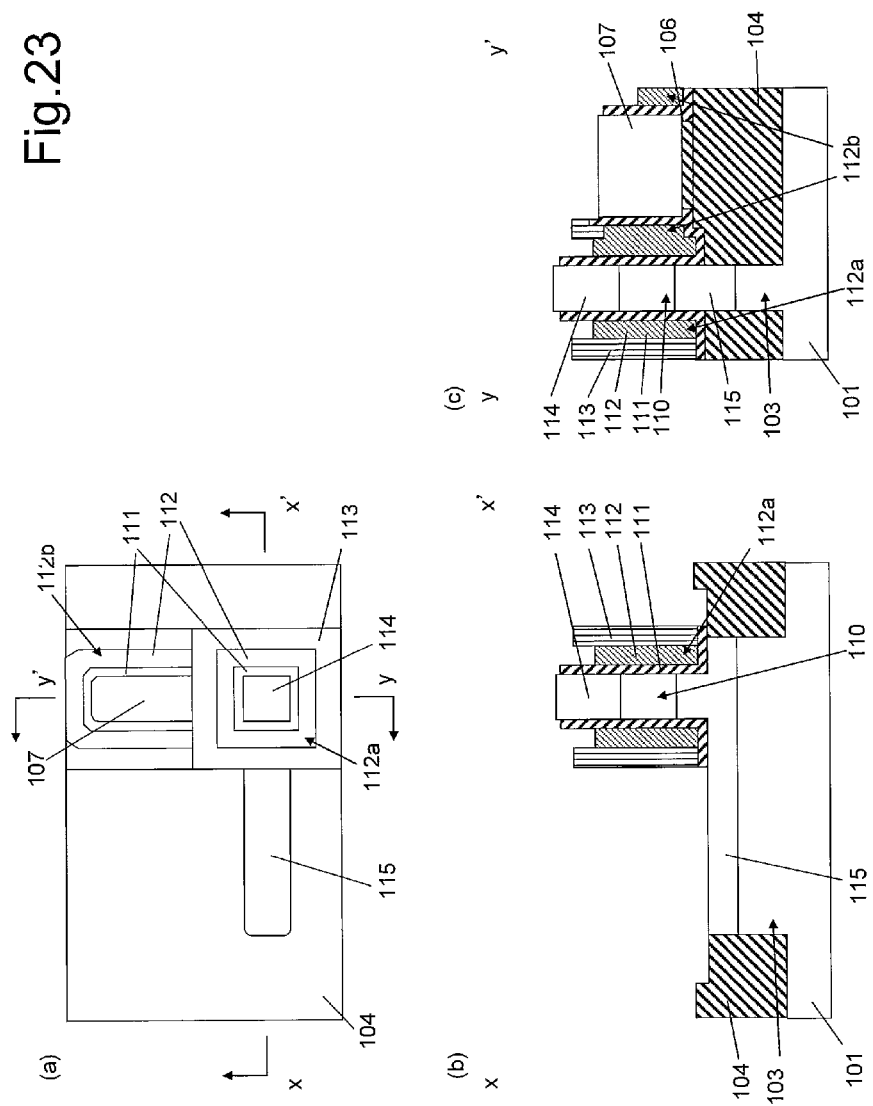

In FIG. 23, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 24, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

Figure 25:
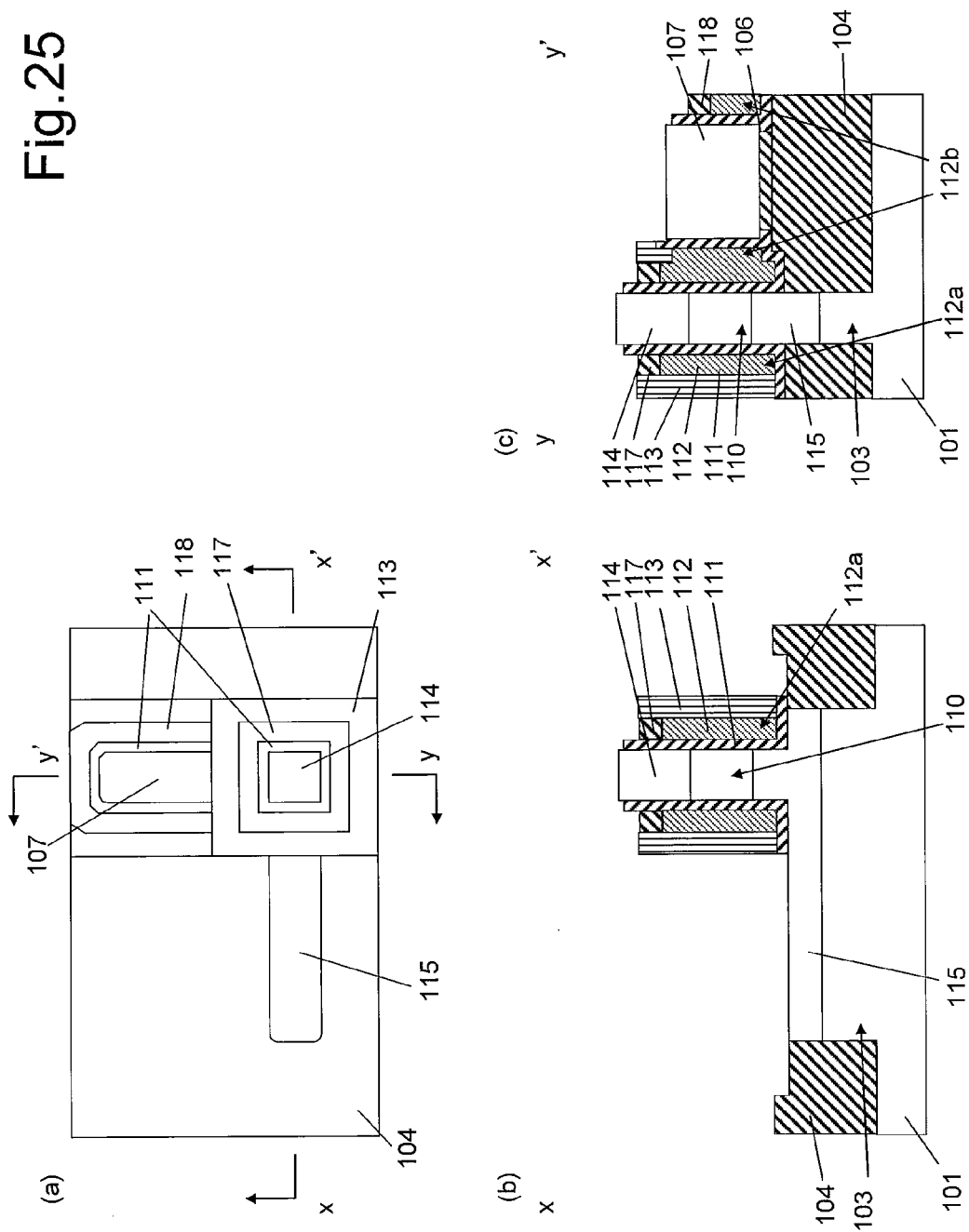

In FIG. 25, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 26, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 27, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 28, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 29, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 30, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 31, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 32, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 33, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 34, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 35, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

In FIG. 36, part (a) is a plan view illustrating the method for producing a semiconductor device according to an embodiment of the present invention, part (b) is a cross-sectional view taken along line x-x' of part (a), and part (c) is a cross-sectional view taken along line y-y' of part (a).

DESCRIPTION OF THE PREFERRED EMBODIMENTS

In the above-described method for producing an SGT, since the depths of contacts are different, a contact hole above an upper portion of a silicon pillar and a contact hole above a planar silicon layer of a lower portion of the silicon pillar are separately formed (refer to, for example, Japanese Unexamined Patent Application Publication No. 2012-004244). Since the contact holes are separately formed in this manner, the number of steps necessary for the production increases.

In order to reduce the parasitic capacitance between a gate line and a substrate, a first insulating film is used in a MOS transistor. For example, in FINFETs (refer to, for example, High performance 22/20 nm FinFET CMOS devices with advanced high-K/metal gate scheme, IEDM2010 CC. Wu, et. al, 27.1.1 to 27.1.4), the parasitic capacitance between a gate line and a substrate is reduced by forming a first insulating film around one fin-shaped semiconductor layer, and etching back the first insulating film to expose the fin-shaped semiconductor layer. Therefore, also in SGTs, it is necessary to use a first insulating film in order to reduce the parasitic capacitance between a gate line and a substrate. In SGTs, in addition to a fin-shaped semiconductor layer, a pillar-shaped semiconductor layer is present, and thus it is necessary to employ a certain device in order to form this pillar-shaped semiconductor layer.

A method for producing a semiconductor device (SGT) according to an embodiment of the present invention and a structure of a semiconductor device (SGT) obtained by the method will now be described with reference to FIGS. 2 to 36.

First, a first step of forming a fin-shaped silicon layer 103 on a silicon substrate 101 using a first mask and forming a first insulating film 104 around the fin-shaped silicon layer 103 will now be described.

Specifically, as illustrated in FIG. 2, a first resist 102 used for forming a fin-shaped silicon layer 103 is formed on a silicon substrate 101.

Subsequently, as illustrated in FIG. 3, the silicon substrate 101 is etched by using the first resist 102 as a first mask to form the fin-shaped silicon layer 103. In this embodiment, the fin-shaped silicon layer is formed by using a resist as the first mask. Alternatively, a hard mask such as an oxide film or a nitride film may be used as the first mask.

Subsequently, as illustrated in FIG. 4, the first resist 102 is removed.

Subsequently, as illustrated in FIG. 5, a first insulating film 104 is deposited around the fin-shaped silicon layer 103. As the first insulating film 104, an oxide film formed by using high-density plasma or an oxide film formed by low-pressure chemical vapor deposition (CVD) may be used.

Subsequently, as illustrated in FIG. 6, the first insulating film 104 is etched back to expose an upper portion of the fin-shaped silicon layer 103. The step that has been described above is the same as the method for producing a fin-shaped silicon layer disclosed in High performance 22/20 nm FinFET CMOS devices with advanced high-K/metal gate scheme, IEDM2010 CC. Wu, et. al, 27.1.1 to 27.1.4.

A description has been made of the first step of the present embodiment, that is, the step of forming a fin-shaped silicon layer 103 on a silicon substrate 101 using a first resist 102 as a first mask, and forming a first insulating film 104 around the fin-shaped silicon layer 103.

A second step of the present embodiment will now be described. Specifically, a second insulating film 105 is formed around the fin-shaped silicon layer 103, and the second insulating film 105 is etched so as to be left on a side wall of the fin-shaped silicon layer 103. Subsequently, a third insulating film 106 is deposited on the second insulating film 105, the fin-shaped silicon layer 103, and the first insulating film 104. Subsequently, a polysilicon 107 is deposited on the third insulating film 106, a surface of the polysilicon 107 is planarized by a chemical mechanical polishing (CMP) method or the like, and the polysilicon 107 is further etched back to thereby expose the third insulating film 106 located on an upper portion of the fin-shaped silicon layer 103. Subsequently, a second resist 109 used for forming a gate line 112b and a pillar-shaped silicon layer 110 is formed so as to extend in a second direction (front and back direction) perpendicular to a first direction (horizontal direction) in which the fin-shaped silicon layer 103 extends. Subsequently, by using the second resist 109 as a second mask, the third insulating film 106 and the second insulating film 105 are etched, and the fin-shaped silicon layer 103 and the polysilicon 107 are then etched. Furthermore, the second insulating film 105 is removed to form the pillar-shaped silicon layer 110 and a dummy gate formed of the polysilicon 107.

Specifically, as illustrated in FIG. 7, a second insulating film 105 is formed around the fin-shaped silicon layer 103. This second insulating film 105 is preferably an oxide film formed by atmospheric pressure chemical vapor deposition (CVD), which has a high wet-etching rate. Alternatively, the second insulating film 105 may be an oxide film formed by low-pressure chemical vapor deposition (CVD).

Subsequently, as illustrated in FIG. 8, the second insulating film 105 is etched. Thus, the second insulating film 105 is left on a side wall of the fin-shaped silicon layer 103.

Subsequently, as illustrated in FIG. 9, a third insulating film 106 having a small thickness is deposited on the second insulating film 105, the fin-shaped silicon layer 103, and the first insulating film 104. An oxide film formed by low-pressure chemical vapor deposition (CVD) is preferably used as the third insulating film 106. The thickness of the third insulating film 106 is preferably determined such that the third insulating film 106 and the second insulating film 105 are removed substantially at the same time when the second insulating film 105 is removed.

Subsequently, as illustrated in FIG. 10, a polysilicon 107 is deposited on the third insulating film 106, and a surface of the polysilicon 107 is planarized by a chemical mechanical polishing (CMP) method or the like.

Subsequently, as illustrated in FIG. 11, the polysilicon 107 is etched back to thereby expose the third insulating film 106 located on an upper portion of the fin-shaped silicon layer 103.

Subsequently, as illustrated in FIG. 12, a fourth insulating film 108 is deposited on the exposed third insulating film 106. This fourth insulating film 108 is also preferably an oxide film formed by atmospheric pressure chemical vapor deposition (CVD), which has a high wet-etching rate, as in the second insulating film 105. Thereafter, a nitride film may be further deposited.

Subsequently, as illustrated in FIG. 13, a second resist 109 used for forming a gate line 112b and a pillar-shaped silicon layer 110 is formed so as to extend in a second direction (front and back direction) perpendicular to a first direction (horizontal direction) in which the fin-shaped silicon layer 103 extends.

Subsequently, as illustrated in FIG. 14, the fourth insulating film 108, the third insulating film 106, and the second insulating film 105 are etched by using the second resist 109 as a second mask.

Subsequently, as illustrated in FIG. 15, by etching the fin-shaped silicon layer 103 and the polysilicon 107, a pillar-shaped silicon layer 110 and a dummy gate formed of the polysilicon 107 are formed from the fin-shaped silicon layer 103 and the polysilicon 107.

Subsequently, as illustrated in FIG. 16, the second resist 109 is removed.

Subsequently, as illustrated in FIG. 17, the second insulating film 105 is removed. Since the fourth insulating film 108 is composed of the same material as the second insulating film 105 (in the present embodiment, an oxide film formed by atmospheric pressure CVD), the fourth insulating film 108 is also removed when the second insulating film 105 is removed. In addition, the third insulating film 106 having a small thickness is also removed in this step. The second insulating film 105, the fourth insulating film 108, and the third insulating film 106 are preferably removed by wet etching.

A description has been made of the second step of the present embodiment, that is, the step of forming a second insulating film 105 around the fin-shaped silicon layer 103, and etching the second insulating film 105 so that the second insulating film 105 is left on a side wall of the fin-shaped silicon layer 103; subsequently depositing a third insulating film 106 on the second insulating film 105, the fin-shaped silicon layer 103, and the first insulating film 104; subsequently, depositing a polysilicon 107 on the third insulating film 106, planarizing a surface of the polysilicon 107 by a chemical mechanical polishing (CMP) method or the like, and subsequently etching back the polysilicon 107 to thereby expose the third insulating film 106 located on an upper portion of the fin-shaped silicon layer 103; subsequently forming a second resist 109 used for forming a gate line 112b and a pillar-shaped silicon layer 110 so as to extend in a second direction perpendicular to a first direction in which the fin-shaped silicon layer 103 extends; subsequently, by using the second resist 109 as a second mask, etching the third insulating film 106 and the second insulating film 105, and then etching the fin-shaped silicon layer 103 and the polysilicon 107; and further removing the second insulating film 105 to thereby form the pillar-shaped silicon layer 110 and a dummy gate formed of the polysilicon 107.

A third step of the present embodiment will now be described. Specifically, after the second step, a gate insulating film 111 is formed, a gate conductive film 112 is deposited around the gate insulating film 111, and the gate conductive film 112 is etched. Thus, the gate conductive film 112 is left on a side wall of the dummy gate formed of the polysilicon 107 and on a side wall of the pillar-shaped silicon layer 110 to form a gate electrode 112a and a gate line 112b.

Specifically, as illustrated in FIG. 18, a gate insulating film 111 is formed on the resulting laminate, and a gate conductive film 112 is further deposited around the gate insulating film 111. In this step, as the gate conductive film 112, a metal material that is used in a semiconductor manufacturing process and that determines a threshold voltage of a transistor, for example, titanium nitride, titanium, tantalum nitride, or tantalum, is preferably used. Among these, a material having an etching rate in wet etching higher than that of silicon is preferably used as the gate conductive film 112. In addition, a material used in a semiconductor manufacturing process, such as an oxide film, an oxynitride film, or a high-K dielectric film, is preferably used as the gate insulating film 111.

Subsequently, as illustrated in FIG. 19, by etching a predetermined region of the gate conductive film 112, a part of the gate conductive film 112 is left on a side wall of the dummy gate formed of the polysilicon 107 and on a side wall of the pillar-shaped silicon layer 110. Thus, a gate electrode 112a is formed on the side wall of the pillar-shaped silicon layer 110, and a gate line 112b is formed, as a sidewall-shape, on the side wall of the dummy gate formed of the polysilicon 107.

According to the present embodiment, as described above, the fin-shaped silicon layer 103, the pillar-shaped silicon layer 110, and the gate line 112b can be formed by using the two masks. Thus, the number of steps necessary for producing a semiconductor device (SGT) can be reduced. Furthermore, according to the present embodiment, the formation position of the pillar-shaped silicon layer 110 and the formation position of the gate line 112b are aligned so as to be located in one straight line. Accordingly, the shift between the position of the pillar-shaped silicon layer 110 and the position of the gate line 112b can be eliminated.

A description has been made of the third step of the present embodiment, that is, the step of forming a gate insulating film 111, depositing a gate conductive film 112 around the gate insulating film 111, and etching the gate conductive film 112 to thereby form a gate electrode 112a on a side wall of the pillar-shaped silicon layer 110 and, as a sidewall-shape, a gate line 112b on a side wall of the dummy gate formed of the polysilicon 107.

A fourth step of the present embodiment will now be described. Specifically, after the third step, a first nitride film 113 is deposited, and by etching the first nitride film 113, the first nitride film 113 is left on a side wall of the gate electrode 112a and on a side wall of the gate line 112b and an upper portion of the gate conductive film 112 is exposed. The exposed upper portion of the gate conductive film 112 is removed by etching.

Specifically, as illustrated in FIG. 20, a first nitride film 113 is deposited.

Subsequently, as illustrated in FIG. 21, by etching the first nitride film 113, the first nitride film 113 is left on a side wall of the gate electrode 112a and on a side wall of the gate line 112b and an upper portion of the gate conductive film 112 is exposed.

Subsequently, as illustrated in FIG. 22, the exposed upper portion of the gate conductive film 112 is removed by etching.

A description has been made of the fourth step of the present embodiment, that is, the step of depositing a first nitride film 113, etching the first nitride film 113 so that the first nitride film 113 is left on a side wall of the gate electrode 112a and on a side wall of the gate line 112b and so that an upper portion of the gate conductive film 112 is exposed; and removing the exposed upper portion of the gate conductive film 112 by etching.

Subsequent to the step illustrated in FIG. 22, as illustrated in FIG. 23, by implanting arsenic into a predetermined position of the pillar-shaped silicon layer 110, a first diffusion layer 114 and a second diffusion layer 115 are formed. In this embodiment, an nMOS is formed. Alternatively, in the case where a pMOS is formed, boron or boron fluoride is implanted.

Subsequently, as illustrated in FIG. 24, an oxide film 116 is deposited on the laminate, and heat treatment is then conducted. In this step, a nitride film may be used instead of the oxide film.

Subsequently, as illustrated in FIG. 25, the oxide film 116 is removed by etching so that a part of the oxide film 116 is left. In this step, wet etching is preferably used. Thus, an oxide film 117 is left between the first nitride film 113 and the pillar-shaped silicon layer 110, and an oxide film 118 is left between the first nitride film 113 and the dummy gate formed of the polysilicon 107. Dry etching may be used instead of wet etching.

Subsequently, as illustrated in FIG. 26, a metal material is deposited on predetermined positions of the laminate, heat treatment is conducted, and the unreacted metal material is then removed. Thus, a first silicide 120 and a second silicide 119 are formed on the first diffusion layer 114 and the second diffusion layer 115, respectively. In this step, a silicide 121 is formed on the top of the dummy gate formed of the polysilicon 107.

A fifth step of the present embodiment will now be described. Specifically, after the fourth step, an interlayer insulating film 123 is deposited, a surface thereof is planarized by a chemical mechanical polishing (CMP) method or the like, and the interlayer insulating film 123 is further etched back to thereby expose an upper portion of the pillar-shaped silicon layer 110. Subsequently, a third resist 124 used for forming first contacts 129 and 130 is formed, and the interlayer insulating film 123 is etched to thereby form contact holes 125 and 126. Subsequently, a metal material 128 is deposited in the contact holes 125 and 126 to thereby form the first contact 129 on the fin-shaped silicon layer 103. Subsequently, fourth resists 131, 132, and 133 used for forming metal wirings 134, 135, and 136, respectively, are formed, and etching is conducted to thereby form the metal wirings 134, 135, and 136, respectively.

Specifically, as illustrated in FIG. 27, a nitride film 122 is deposited on a predetermined region of the laminate, and an interlayer insulating film 123 is formed so as to cover the nitride film 122.

Specifically, as illustrated in FIG. 28, the interlayer insulating film 123 is etched back to expose the nitride film 122 above the pillar-shaped silicon layer 110.

Subsequently, as illustrated in FIG. 29, a third resist 124 used for forming contact holes 125 and 126 is formed at predetermined positions of the laminate.

Subsequently, as illustrated in FIG. 30, the interlayer insulating film 123 exposed from the third resist 124 is etched to form the contact holes 125 and 126.

Subsequently, as illustrated in FIG. 31, the third resist 124 is removed by stripping.

Subsequently, as illustrated in FIG. 32, by etching the nitride film 122, the nitride film 122 located on the bottom of the contact hole 125, and the nitride film 122 located on the pillar-shaped silicon layer 110 are removed. In this step, a nitride film 127 may remain on a side wall of the pillar-shaped silicon layer 110 (refer to FIG. 32).

Subsequently, as illustrated in FIG. 33, by depositing a metal material 128 so as to embed the contact holes 125 and 126, the metal material 128 is formed so that first contacts 129 and 130 are formed in the contact holes 125 and 126, respectively, and so that the metal material 128 is connected to the first contacts 129 and 130 and the first silicide 120 located on an upper portion of the pillar-shaped silicon layer 110.

Subsequently, as illustrated in FIG. 34, fourth resists 131, 132, and 133 used for forming metal wirings 134, 135, and 136, respectively, are formed at predetermined positions on the laminate.

Subsequently, as illustrated in FIG. 35, the metal material 128 exposed from the fourth resists 131, 132, and 133 is etched to form the metal wirings 134, 135, and 136, respectively.

Subsequently, as illustrated in FIG. 36, the fourth resists 131, 132, and 133 are stripped.

According to the above step, since the metal wirings 134, 135, and 136 formed of the metal material 128 are directly electrically connected to the upper portion of the pillar-shaped silicon layer 110 without a contact therebetween, a step of separately forming a contact on the upper portion of the pillar-shaped silicon layer 110 is not necessary. In addition, since the contact holes 125 and 126 in which the first contacts 129 and 130 are to be formed are formed above the fin-shaped silicon layer 103, the depths of the contact holes 125 and 126 can be made shallow. Consequently, the contact holes 125 and 126 can be easily formed, and furthermore, the contact holes 125 and 126 can be easily embedded with the metal material 128.

A description has been made of the fifth step of the present embodiment, that is, the step of depositing an interlayer insulating film 123 on the laminate, planarizing a surface of the interlayer insulating film 123 by a chemical mechanical polishing (CMP) method or the like, and etching back the interlayer insulating film 123 to thereby expose an upper portion of the pillar-shaped silicon layer 110; subsequently forming a third resist 124 used for forming first contacts 129 and 130, and etching the interlayer insulating film 123 to thereby form contact holes 125 and 126; depositing a metal material 128 in the contact holes 125 and 126 to thereby form the first contacts 129 and 130 on the fin-shaped silicon layer 103; and subsequently forming fourth resists 131, 132, and 133 used for forming metal wirings 134, 135, and 136, respectively, and conducting etching to thereby form the metal wirings 134, 135, and 136, respectively.

A description has been made of a method for producing a semiconductor device (SGT) with which a fin-shaped silicon layer 103, a pillar-shaped silicon layer 110, and a gate line 112b are formed by using two masks. According to this method for producing an SGT, the whole SGT can be formed by using total four masks.

Figure 1:
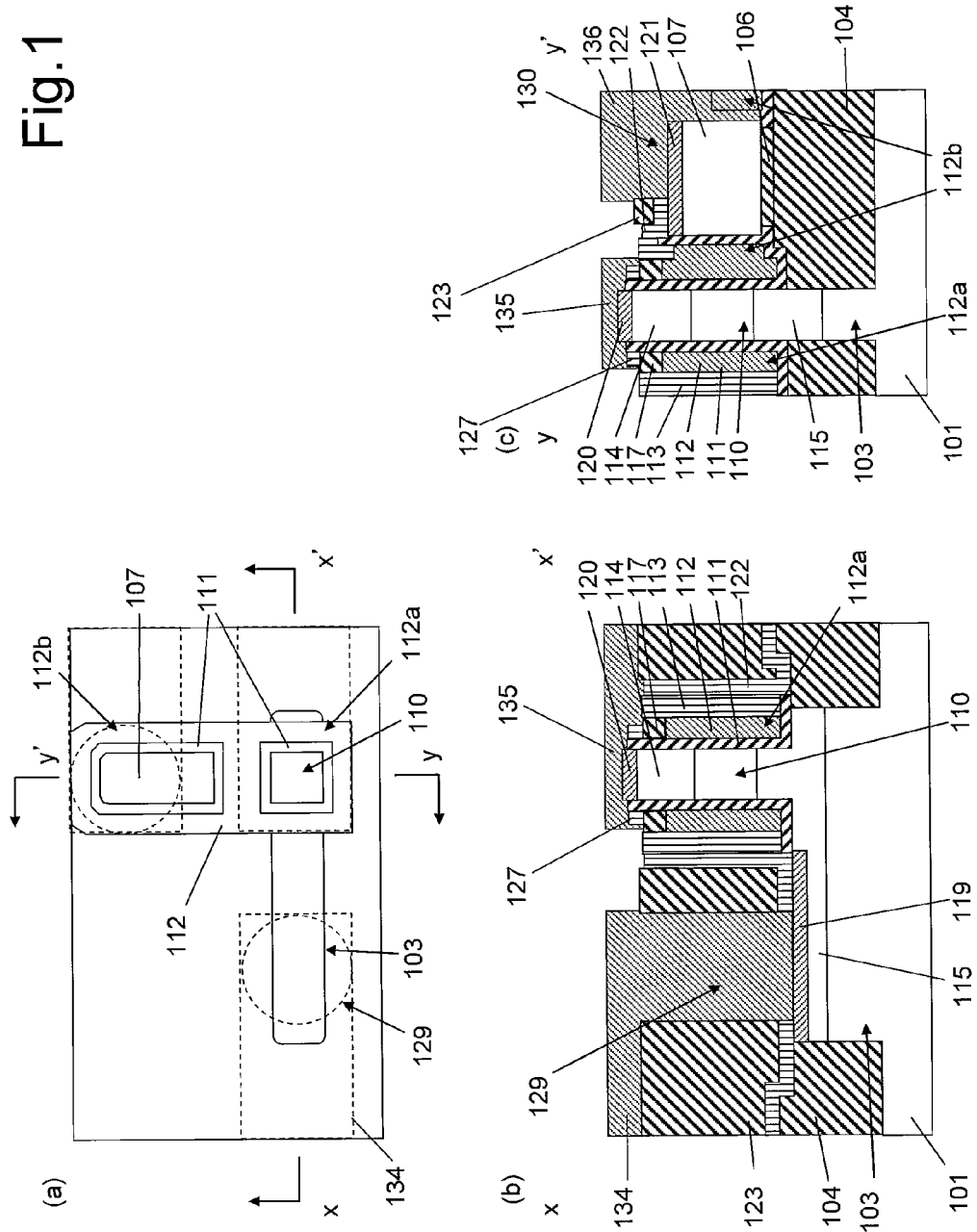
In FIG. 1, part (a) is a plan view of a semiconductor device according to an embodiment of the present invention, part (b)

FIG. 1 illustrates a structure of a semiconductor device according to the present embodiment, the semiconductor device being obtained by the above-described method for producing a semiconductor device. As illustrated in FIG. 1, a semiconductor device of the present embodiment includes a fin-shaped silicon layer 103 formed on a silicon substrate 101, a first insulating film 104 formed around the fin-shaped silicon layer 103, and a pillar-shaped silicon layer 110 formed on the fin-shaped silicon layer 103. A width of the pillar-shaped silicon layer 110 is equal to a width of the fin-shaped silicon layer 103. The semiconductor device of the present embodiment further includes a gate insulating film 111 formed around the pillar-shaped silicon layer 110, a gate electrode 112a formed around the gate insulating film 111, and a gate line 112b connected to the gate electrode 112a and extending in a second direction (front and back direction) perpendicular to a first direction (horizontal direction) in which the fin-shaped silicon layer 103 extends. The gate line 112b is formed, as a sidewall-shape, on a side wall of a dummy gate formed of a polysilicon 107. The semiconductor device of the present embodiment further includes a first diffusion layer 114 formed in an upper portion of the pillar-shaped silicon layer 110 and a second diffusion layer 115 formed over an upper portion of the fin-shaped silicon layer 103 and a lower portion of the pillar-shaped silicon layer 110.

According to the above embodiment, the gate line 112b is formed, as a sidewall-shape, on the side wall of the dummy gate formed of the polysilicon 107. Therefore, the resistance of the gate line 112b is determined by the height of the dummy gate formed of the polysilicon 107. Thus, the resistance of the gate line 112b can be suppressed to be low, as compared with the case where a gate line is formed so as to have a thin, planar shape.

According to the above embodiment, in the first step, a fin-shaped silicon layer 103 is formed on a silicon substrate 101 using a first resist 102 as a first mask, and a first insulating film 104 is formed around the fin-shaped silicon layer 103. In the second step, a second insulating film 105 is formed around the fin-shaped silicon layer 103, and the second insulating film 105 is etched so as to be left on a side wall of the fin-shaped silicon layer. Subsequently, a third insulating film 106 is deposited on the second insulating film 105, the fin-shaped silicon layer 103, and the first insulating film 104. A polysilicon 107 is deposited on the third insulating film 106, a surface of the polysilicon 107 is planarized by a chemical mechanical polishing (CMP) method or the like, and the polysilicon 107 is then etched back to thereby expose the third insulating film 106 located on an upper portion of the fin-shaped silicon layer 103. Subsequently, a second resist 109 used for forming a gate line 112b and a pillar-shaped silicon layer 110 is formed so as to extend in a second direction perpendicular to a first direction in which the fin-shaped silicon layer 103 extends. The third insulating film 106 and the second insulating film 105 are etched using the second resist 109 as a second mask. Subsequently, the fin-shaped silicon layer 103 and the polysilicon 107 are etched. Subsequently, the second insulating film 105 is removed to thereby form a pillar-shaped silicon layer 110 and a dummy gate formed of the polysilicon 107.

According to the above embodiment, as described above, the fin-shaped silicon layer 103, the pillar-shaped silicon layer 110, and the gate line 112b can be formed by using the two masks (first mask and second mask). Thus, the number of steps necessary for producing a semiconductor device can be reduced.

Furthermore, according to the above embodiment, the formation position of the pillar-shaped silicon layer 110 and the formation position of the gate line 112b are aligned so as to be located in one straight line. Accordingly, the shift between the position of the pillar-shaped silicon layer 110 and the position of the gate line 112b can be eliminated. Since the dummy gate is formed of the polysilicon 107, in removing the second insulating film 105, the removal of the dummy gate by etching is suppressed.

According to the above embodiment, the gate line 112b is formed, as a sidewall-shape, on the side wall of the dummy gate formed of the polysilicon 107. Accordingly, the resistance of the gate line 112b is determined by the height of the dummy gate formed of the polysilicon 107. Therefore, the resistance of the gate line 112b can be suppressed to be low, as compared with the case where a thin, planar gate line 112b is formed.

It is to be understood that various embodiments and modifications of the present invention can be made without departing from the broad spirit and scope of the present invention. The embodiment described above is an illustrative example of the present invention and does not limit the scope of the present invention.

For example, in the above embodiment, a method for producing a semiconductor device in which the p type (including the $p^+$ type) and the n type (including the $n^+$ type) are each changed to the opposite conductivity type, and a semiconductor device obtained by the method are also included in the technical scope of the present invention.

The invention claimed is:

1. A method of producing a semiconductor device, the method comprising:
    a first step of forming a fin-shaped silicon layer on a silicon substrate using a first mask and forming a first insulating film around the fin-shaped silicon layer; and
    a second step of forming a second insulating film around the fin-shaped silicon layer and
    etching the second insulating film so that the second insulating film is left on a side wall of the fin-shaped silicon layer,
    depositing a third insulating film on the second insulating film, the fin-shaped silicon layer, and the first insulating film,
    depositing polysilicon on the third insulating film, planarizing a surface of the polysilicon, and subsequently etching back the polysilicon to thereby expose the third insulating film located on an upper portion of the fin-shaped silicon layer,
    forming a second resist used for forming a gate line and a pillar-shaped silicon layer so as to extend in a second direction perpendicular to a first direction in which the fin-shaped silicon layer extends,
    etching the third insulating film and the second insulating film and then etching the fin-shaped silicon layer and the polysilicon by using the second resist as a second mask, and further removing the second insulating film to thereby form the pillar-shaped silicon layer and a dummy gate formed of the polysilicon.

2. The method for producing a semiconductor device according to claim 1, which comprises, after the polysilicon is deposited on the third insulating film, planarizing a surface of the polysilicon, and etching the polysilicon back to thereby expose the third insulating film located on the upper portion of the fin-shaped silicon layer, and depositing a fourth insulating film on the exposed third insulating film.

3. The method for producing a semiconductor device according to claim 1, further comprising, after the second step, a third step of forming a gate insulating film, forming a gate conductive film around the gate insulating film, and etching the gate conductive film so that the gate conductive film is left on a side wall of the dummy gate and on a side wall of the pillar-shaped silicon layer to form a gate electrode and a gate line.

4. The method for producing a semiconductor device according to claim 3, further comprising, after the third step, a fourth step of depositing a first nitride film, etching the first nitride film so that the first nitride film is left on a side wall of the gate electrode and on a side wall of the gate line and so that an upper portion of the gate conductive film is exposed, and removing the exposed upper portion of the gate conductive film by etching.

5. The method for producing a semiconductor device according to claim 4, further comprising, after the fourth step, a fifth step of depositing an interlayer insulating film, planarizing a surface of the interlayer insulating film, and etching back the interlayer insulating film to thereby expose an upper portion of the pillar-shaped silicon layer, subsequently forming a third resist used for forming a first contact, and etching the interlayer insulating film to thereby form a contact hole, depositing a metal material in the contact hole to thereby form the first contact on the fin-shaped silicon layer, and subsequently forming a fourth resist used for forming a metal wiring, and conducting etching to thereby form the metal wiring.

* * * * *